United States Patent
Yamazaki

(10) Patent No.: US 8,174,006 B2
(45) Date of Patent: May 8, 2012

(54) SEMICONDUCTOR DEVICE AND MANUFACTURING METHOD THEREOF AND METHOD FOR WRITING MEMORY ELEMENT

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 28 days.

(21) Appl. No.: 12/874,574

(22) Filed: Sep. 2, 2010

(65) Prior Publication Data

US 2010/0328989 A1 Dec. 30, 2010

Related U.S. Application Data

(62) Division of application No. 11/414,496, filed on May 1, 2006, now Pat. No. 7,791,066.

(30) Foreign Application Priority Data

May 20, 2005 (JP) ................................. 2005-147599

(51) Int. Cl.
*H01L 35/24* (2006.01)
(52) U.S. Cl. ........... 257/40; 257/2; 257/3; 257/E51.001; 438/99; 365/148
(58) Field of Classification Search .................. 257/2, 3, 257/40, E51.001; 438/99; 365/148
See application file for complete search history.

(56) References Cited

U.S. PATENT DOCUMENTS

| | | | |
|---|---|---|---|
| 4,409,604 A | 10/1983 | Fotland | |
| 5,206,665 A | 4/1993 | Kawade et al. | |
| 5,389,475 A | 2/1995 | Yamagisawa et al. | |
| 5,579,135 A | 11/1996 | Kajiyama et al. | |
| 5,883,397 A | 3/1999 | Isoda et al. | |
| 6,528,815 B1 | 3/2003 | Brown et al. | |
| 6,723,396 B1 | 4/2004 | Patrick | |
| 6,806,526 B2 | 10/2004 | Krieger et al. | |
| 6,809,952 B2 | 10/2004 | Masui | |
| 6,828,685 B2 | 12/2004 | Stasiak | |
| 6,858,270 B2 | 2/2005 | Patrick | |
| 6,947,321 B2 | 9/2005 | Tanabe | |
| 6,950,331 B2 | 9/2005 | Yang et al. | |

FOREIGN PATENT DOCUMENTS

| | | |
|---|---|---|
| EP | 1 381 054 | 1/2004 |
| JP | 07-022669 | 1/1995 |
| JP | 2004-047791 | 2/2004 |

OTHER PUBLICATIONS

Office Action (Application No. 200610082463.2) dated Dec. 5, 2008 with English translation.

*Primary Examiner* — Anthony Ho
(74) *Attorney, Agent, or Firm* — Eric J. Robinson; Robinson Intellectual Property Law Office, P.C.

(57) ABSTRACT

An object is to provide a higher-performance and higher-reliability memory device and a semiconductor device provided with the memory device at low cost and with high yield. A semiconductor device of the invention has a memory element including an insulating layer and an organic compound layer between first and second conductive layers. When melting, an organic compound of the organic compound layer aggregates due to surface tension of the organic compound. By applying a voltage to the first and second conductive layers, writing to the memory element is carried out.

24 Claims, 18 Drawing Sheets

90

91

97

93

94

95

96

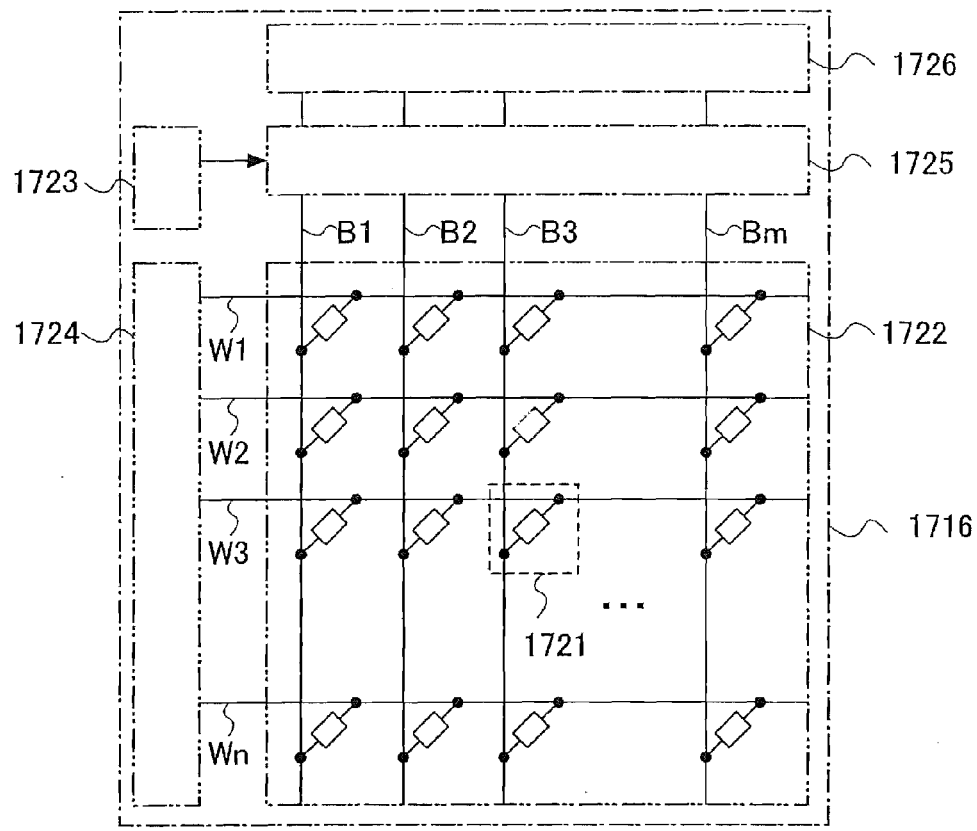
FIG.17A
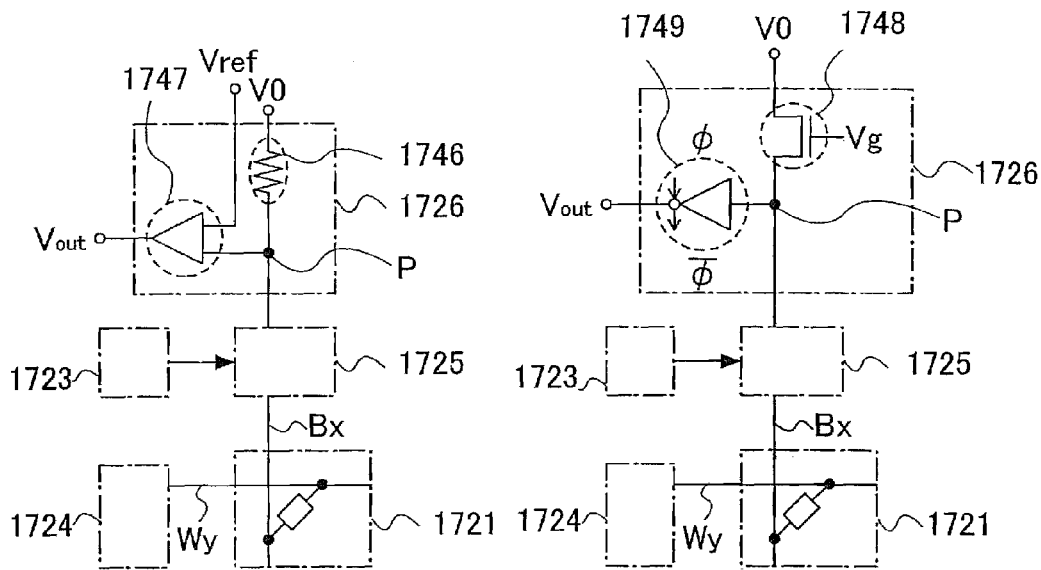
FIG.17B
FIG.17C

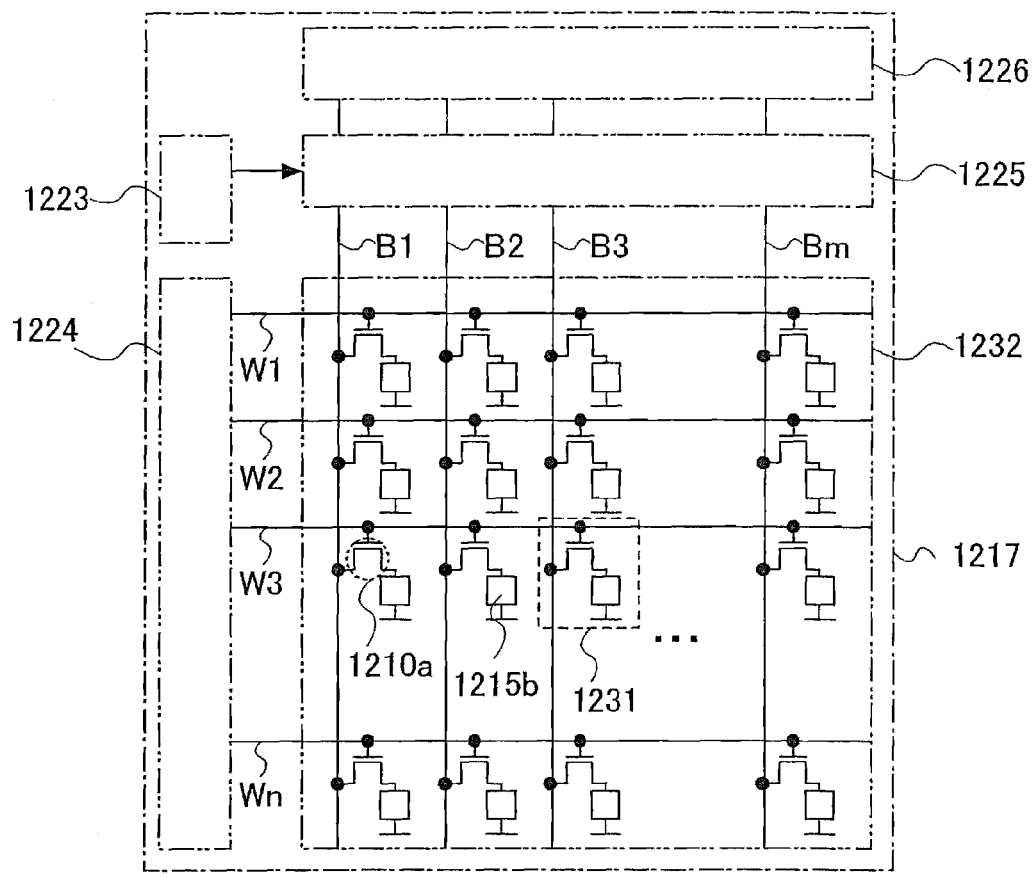
FIG.18A
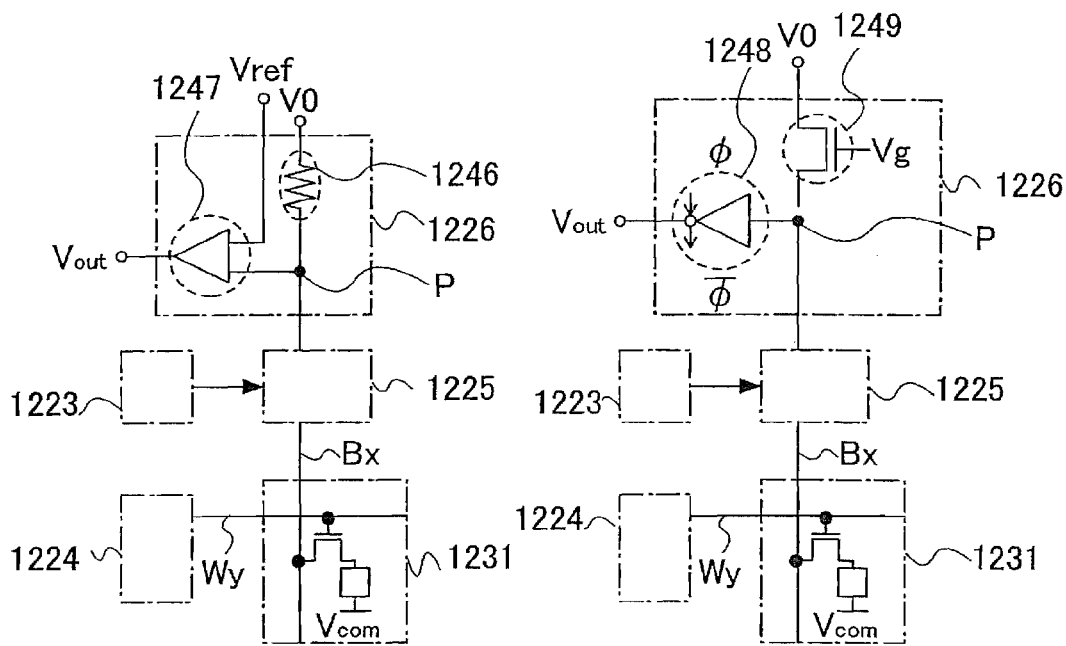
FIG.18B
FIG.18C

SEMICONDUCTOR DEVICE AND MANUFACTURING METHOD THEREOF AND METHOD FOR WRITING MEMORY ELEMENT

BACKGROUND OF THE INVENTION

1. Field of the Invention

The present invention relates to a semiconductor device and a manufacturing method thereof.

2. Description of the Related Art

In recent years, object recognition technology which can be utilized for production, management, or the like by assigning IDs (identification numbers) to individual objects to reveal data thereon such as the history, has attracted much attention. Above all, semiconductor devices that can send and receive data without contact have been in development. As such semiconductor devices, RFIDs (Radio Frequency Identification) (also referred to as ID tags, IC tags, IC chips, RF (Radio Frequency) tags, wireless tags, electronic tags, and wireless chips) and the like are beginning to be adopted in companies, markets, and the like.

Many of these semiconductor devices each include an antenna, and a circuit (hereinafter also referred to as an IC (Integrated Circuit) chip) using a semiconductor substrate of silicon (Si) or the like, and the IC chip is made of a memory circuit (hereinafter also referred to as a memory), a control circuit, and the like. Further, the development of organic thin film transistors (hereinafter also referred to as TFTs), organic memories and the like using organic compounds in their control circuits, memory circuits and the like, is actively pursued (for example, Japanese Patent Laid-Open No. H7-22669).

However, in a memory circuit using an organic compound, in which a memory element is formed by providing an organic compound between a pair of electrodes, in the case where the organic compound layer is thick, the rise in a writing voltage becomes a problem depending on the size of the memory circuit. On the other hand, in the case where the size of the element is small and the organic compound layer is thin, the element is easily affected by dust or a projection and a depression on the surface of the electrode layers, which leads to a problem such as variations in properties of a memory (a writing voltage or the like) or abnormal writing.

SUMMARY OF THE INVENTION

Therefore, the invention provides technique for manufacturing a higher-performance and higher-reliability memory device and a semiconductor device provided with the memory device at low cost and with high yield.

When the temperature of a substance used as an organic compound material rises to the glass-transition temperature of the substance, the substance becomes fluid. Therefore, an organic compound layer made of the substance containing an organic compound material becomes a fluid composition (substance) which has no constant shape at the glass-transition temperature or higher, and behaves like a liquid. When the organic compound layer becomes a fluid composition, the shape of the material in a solid state is not maintained and is transformed with time. Surface tension of the material (substance) or wettability of the surface of a region to be formed against the material, which would not affect much in a solid state begins to significantly influence the transformation of the shape of the composition or the direction, speed, or the like of the material's flow.

Surface tension is energy required to reduce the surface area of a liquid, and can be regarded as energy (energy of cohesion) released when a liquid aggregates into a ball shape. Therefore, when a fluid material has high surface tension, the material easily moves and aggregates to be rounded as a ball. Further, the mobility, direction, speed, or the like of the material due to surface tension significantly relates to the wettability of the surface of a region to be formed against the material.

The wettability of a solid surface that is a substance to be formed is affected by the chemical property of the surface. If the substance has low wettability against a fluid composition, then the surface of the substance becomes a region having low wettability against the fluid material (hereinafter also referred to as a low wettability region), and the contact angle with the material is large. Therefore, the fluid composition does not expand on a region surface and is repelled not to wet the surface. On the other hand, if the substance has high wettability against a fluid composition, then the surface becomes a region having high wettability against the fluid composition (hereinafter also referred to as a high wettability region), the contact angle with the material is small. Therefore, the fluid material expands on the region surface, and wets the surface well. Further, the wettability also relates to the surface energy. The surface energy of a region with low wettability is low, and the surface energy of a region with high wettability is high.

When the wettability of the surface of a region to be formed in which an organic compound material is formed is low (bad wettability) against the material, aggregation of the material due to surface tension is further promoted. The organic compound material for forming an organic compound layer has higher mobility, and the material aggregates on the surface. Accordingly, the film thickness of the organic compound layer can be surely made uneven at short times by providing an insulating layer having bad wettability against an organic compound layer over a first conductive layer over which the organic compound layer is to be formed, the organic compound layer is transformed, and the first conductive layer and a second conductive layer are short-circuited. Furthermore, there is also a case in which an electric field is concentrated in a region where the insulating layer is thin, and a dielectric breakdown occurs, which short-circuits the first and second conductive layers. Consequently, the conductivity of a memory element is different before and after voltage application.

In the invention, an insulating layer having low (bad) wettability against an organic compound material used for an organic compound layer is formed between the organic compound layer that constitutes a memory element included in a memory device and at least one of a pair of conductive layers that are formed with the organic compound layer interposed therebetween. In the invention, the insulating layer has an insulation property. The insulating layer may be a very thin film (the film thickness of the insulating layer is 4 nm or less, more preferably, 1 nm or more and 2 nm or less), and depending on a material and a manufacturing method of the insulating layer, the insulating layer may have not a shape as a continuous film but a discontinuous island-like shape. The insulating layer which is formed at an interface between the conductive layer and the organic compound layer allows the tunnel injection of carriers; therefore, a tunnel current flows. Accordingly, when a voltage is applied between the first and second conductive layers, a current flows to the organic compound layer; thereby generating heat. When the temperature of the organic compound layer rises to its glass-transition temperature, the material for forming the organic compound layer turns into a fluid composition. Because of the surface tension of the composition (organic compound material) and bad wettability against a surface of the insulating layer, the fluid composition aggregates so as to flow (move) without maintaining the shape in a solid state, and change the shape. Consequently, the thickness of the organic compound layer becomes uneven and the organic compound layer is transformed, and the first and second conductive layers are partially brought into contact with each other, and surely short-circuited. As a result, the conductivity of the memory element is different before and after voltage application.

Note that in this specification, a semiconductor device refers to a device that can function by utilizing a semiconductor property. By using the invention, it is possible to manufacture an integrated circuit having a multi-layer wiring layer and a semiconductor device such as a processor chip.

One aspect of a semiconductor device of the invention has a memory element including an insulating layer and an organic compound layer between first and second conductive layers. When melting, an organic compound in the organic compound layer aggregates due to the surface tension of the organic compound. By applying a voltage to the first and second conductive layers, writing to the memory element is carried out.

One aspect of a semiconductor device of the invention has a memory element including an insulating layer and an organic compound layer having contact with the insulating layer between first and second conductive layers. When melting, an organic compound in the organic compound layer aggregates due to the surface tension of the organic compound, which is higher than that of the insulating layer. By applying a voltage to the first and second conductive layers, writing to the memory element is carried out.

One aspect of a semiconductor device of the invention has a memory element including an insulating layer and an organic compound layer having contact with the insulating layer between first and second conductive layers. When melting, an organic compound in the organic compound layer aggregates due to the surface tension of the organic compound. The melted organic compound has low wettability against a surface of the insulating layer. By applying a voltage to the first and second conductive layers, writing to the memory element is carried out.

One aspect of a semiconductor device of the invention is to have a memory element including an insulating layer and an organic compound layer having contact with the insulating layer between first and second conductive layers. When melting, an organic compound in the organic compound layer aggregates due to the surface tension of the organic compound. The melted organic compound has low wettability against a surface of the insulating layer; therefore, the aggregation is promoted. By applying a voltage to the first and second conductive layers, writing to the memory element is carried out.

One aspect of a semiconductor device of the invention has a memory element including an insulating layer and an organic compound layer having contact with the insulating layer between first and second conductive layers. When melting, an organic compound in the organic compound layer aggregates due to the surface tension of the organic compound, which is higher than that of the insulating layer. The melted organic compound has low wettability against a surface of the insulating layer. By applying a voltage to the first and second conductive layers, writing to the memory element is carried out.

One aspect of a semiconductor device of the invention has a memory element including an insulating layer and an organic compound layer having contact with the insulating layer between first and second conductive layers. When melting, an organic compound in the organic compound layer aggregates due to the surface tension of the organic compound, which is higher than that of the insulating layer. The melted organic compound has low wettability against a surface of the insulating layer; therefore, the aggregation is promoted. By applying a voltage to the first and second conductive layers, writing to the memory element is carried out.

In the aforementioned semiconductor device, after writing to the memory element is carried out, a part of the first and second conductive layers may have contact with each other, or the film thickness of the organic compound layer may be changed.

In the aforementioned semiconductor device, when writing to the memory element is carried out by applying a voltage to the first and second conductive layers, the organic compound in the organic compound layer melts.

By the invention, a higher-performance and higher-reliability semiconductor device can be manufactured at low cost and with high yield.

BRIEF DESCRIPTION OF THE DRAWINGS

FIGS. 17A to 17C are diagrams showing a memory device of the invention.

FIGS. 18A to 18C are diagrams showing a memory device of the invention.

DETAILED DESCRIPTION OF THE INVENTION

Figure 1A:
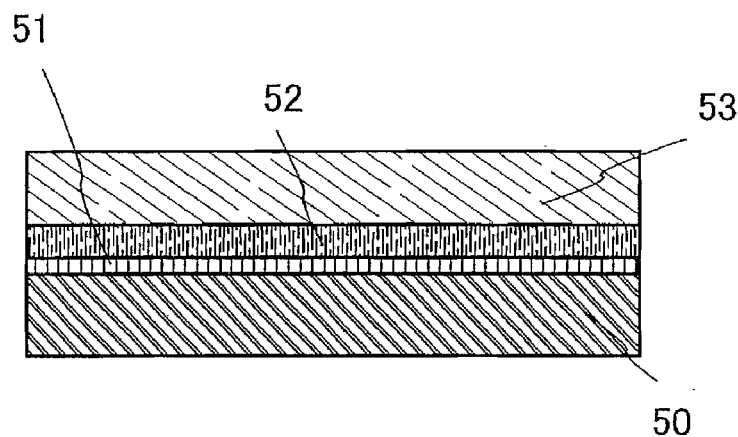
FIGS. 1A to 1D are schematic diagrams showing the invention.
Figure 1B:
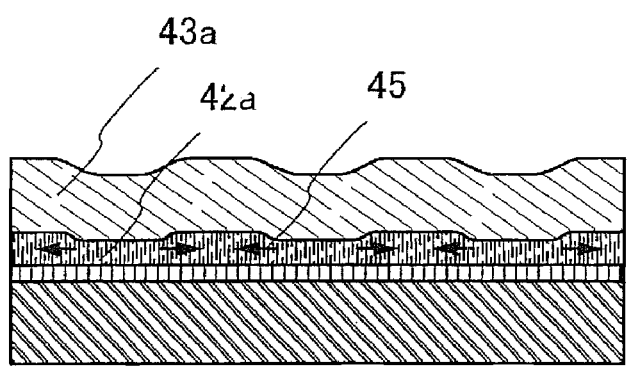
Figure 1C:
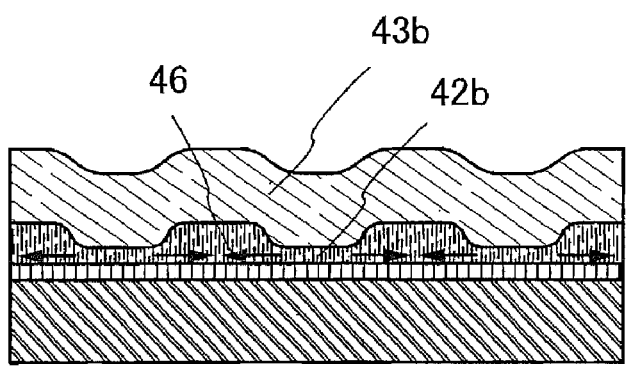

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Further, identical portions or portions having a similar function in structures of the invention are denoted by the same reference numerals in different drawings and description on such portions is omitted.

Embodiment Mode 1

In this embodiment mode, one example of a structure of a memory element included in a memory device of the invention is described with reference to drawings. More specifically, a structure of a passive matrix memory device is described.

A memory element of the invention and an operation mechanism thereof are described with reference to FIGS. 1A to 1D and FIGS. 9A to 9C. In this embodiment mode, an insulating layer having low (bad) wettability against an organic compound material used for an organic compound layer is formed between the organic compound layer that constitutes a memory element included in a memory device and at least one of a pair of conductive layers that are formed with the organic compound layer interposed therebetween. By providing the insulating layer, properties of the memory element are not varied and become stable; therefore, normal writing can be carried out.

The insulating layer is only required to be provided between the conductive layer and the organic compound layer. The insulating layer may be provided between the organic compound layer and one or both of the first and second conductive layers.

Figure 9A:
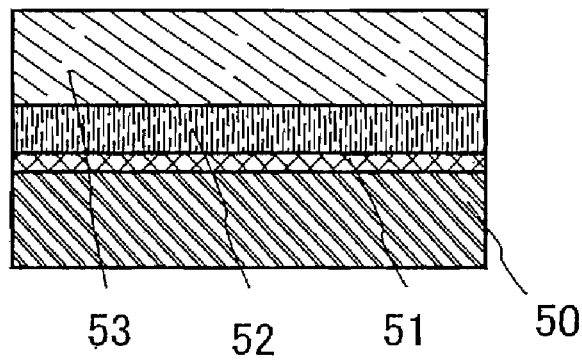
FIGS. 9A to 9C are diagrams showing a memory device of the invention.

FIG. 9A is an example in which the insulating layer is provided between the first conductive layer and the organic compound layer. An insulating layer 51, an organic compound layer 52, and a second conductive layer 53 are formed in this order over a first conductive layer 50.

Figure 9B:
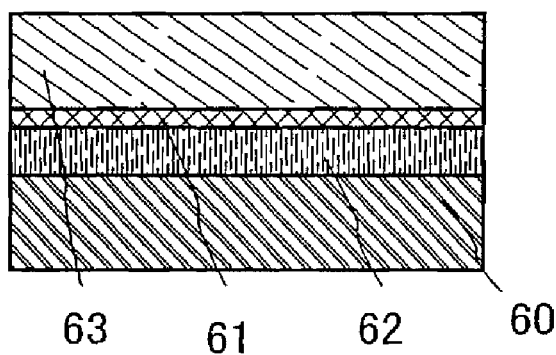

FIG. 9B is an example in which the insulating layer is provided between the second conductive layer and the organic compound layer. An organic compound layer 62, an insulating layer 61, and a second conductive layer 63 are formed in this order over a first conductive layer 60.

Figure 9C:
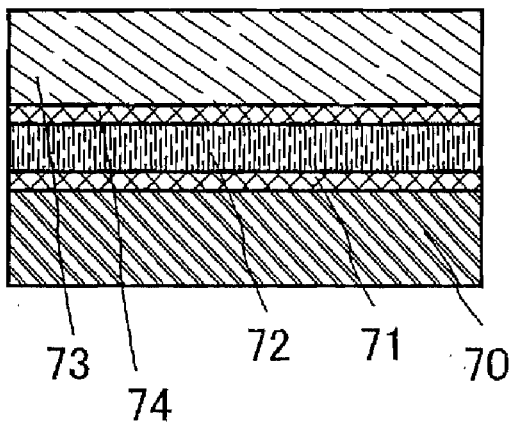

FIG. 9C is an example in which the insulating layer is provided between the organic compound layer and both of the first and second conductive layers. A first conductive layer 70, a first insulating layer 71, an organic compound layer 72, a second insulating layer 74, and a second conductive layer 73 are formed in this order.

As a material for the first conductive layers 50, 60 and 70, and the second conductive layers 53, 63 and 73, an element, a compound, or the like with high conductivity is used. As a material for the organic compound layers 52, 62 and 72, a substance that changes in crystallinity, conductivity, or shape by an electrical effect is used in this embodiment mode. Since the conductivity of the memory element having the aforementioned structure changes before and after voltage application, two values corresponding to an "initial condition" and a "post-conductivity change" can be stored in the memory element. Description is made on the change in the conductivity of the memory element before and after voltage application.

In this embodiment mode, description is made on a principle of an organic memory of the invention with reference to FIGS. 1A to 1D using the organic memory shown in FIG. 9A. FIG. 1A shows the organic memory before applying voltage, which is constituted by the first conductive layer 50, the insulating layer 51, the organic compound layer 52, and the second conductive layer 53. The insulating layer 51 is provided between the first conductive layer 50 and the organic compound layer 52. An organic compound constituting the organic compound layer 52, which turns into a liquid composition, has high surface tension. The liquid composition does not wet and expand, and is repelled on a surface of the insulating layer 51 because it has low (bad) wettability against the surface of the insulating layer 51 provided so as to have contact with the liquid composition.

When the temperature of a substance used as an organic compound material rises to the glass-transition temperature of the substance, the substance becomes fluid. Therefore, an organic compound layer made of the substance containing an organic compound material becomes a fluid composition (substance) which has no constant shape at the glass-transition temperature or higher, and behaves like a liquid. When the organic compound layer becomes a fluid composition, a shape of the material in a solid state is not maintained and is transformed with time. Surface tension of the material (substance) or wettability of the surface of a region to be formed against the material, which would not affect much in a solid state begins to significantly influence the transformation of the shape of the composition or the direction, speed, or the like of the material's flow.

Surface tension is energy required to reduce the surface area of a liquid, and can be regarded as energy (energy of cohesion) released when a liquid aggregates into a ball shape. Therefore, when a fluid material has high surface tension, the material easily moves and aggregates to be rounded as a ball. Further, the mobility, direction, speed, or the like of the material due to surface tension significantly relates to the wettability of the surface of a region to be formed against the material.

When a voltage is applied between the first conductive layer 50 and the second conductive layer 53, a current flows to the organic compound layer; thereby generating heat. When the temperature of the organic compound layer rises to its glass-transition temperature, the organic compound material for forming the organic compound layer turns into a fluid composition. Since the organic compound material constituting the organic compound layer has high surface tension, the organic compound material aggregates more easily than from the insulating layer 51 so as to turn into a spherical shape. The fluid composition aggregates due to high surface tension, so as to move in the direction of an arrow 45; thereby transforming as an organic compound layer 42a. In accordance with the transformation of the organic compound layer 42a, the second conductive layer 53 is also transformed as a second conductive layer 43b (see FIG. 1B).

When the wettability of the surface of a region to be formed in which an organic compound material is formed is low (bad) against the material, aggregation of the material due to surface tension is further promoted. Since the insulating layer 51 has low (bad) wettability against the organic compound material for forming the organic compound layer 52, on the surface of the insulating layer 51, the mobility of the organic compound material in the direction of an arrow 46 is increased; therefore, an organic compound layer 42b is transformed into a shape with a more uneven film thickness. In accordance with the transformation of the organic compound layer 42b, the second conductive layer 43a is also transformed as a second conductive layer 43a (see FIG. 1C).

Figure 1D:
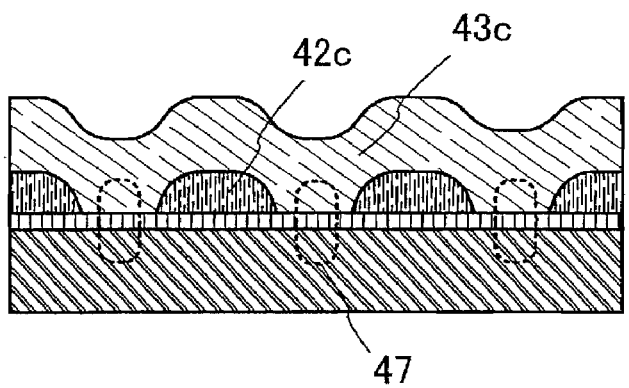

As a result, the organic compound layer 42b is transformed as an organic compound layer 42c and becomes a discontinuous layer over the insulating layer 51; therefore, a region 47 where an organic compound does not exist is formed over the insulating layer 51 (see FIG. 1D). Thereafter, the first conductive layer 50 and a second conductive layer 43c are partially brought into contact with each other. Accordingly, the first conductive layer 50 and the second conductive layer 43c are short-circuited. Further, there is also a case in which an electric field is concentrated in a region where the organic compound layer is thin, and a high electric field may cause a short-circuit between the first and second conductive layers. Consequently, the conductivity of the memory element is different before and after voltage application.

Although FIG. 1D shows an example in which the first and second conductive layers are short-circuited at a plurality of points within one memory element, the invention is not limited to this. When the thickness of the organic compound layer is reduced at least one point within the memory element and the first and second conductive layers are short-circuited, writing to the memory element can be carried out. Needless to say, when the first and second conductive layers are short-circuited at the plurality of points as shown in FIG. 1D, writing to the memory element can be surely carried out; therefore, reliability is improved.

As shown in the embodiment mode, the transformation of the organic compound layer is promoted and the film thickness of the organic compound layer can be made uneven by providing an insulating layer having bad wettability against an organic compound layer over the first conductive layer over which the organic compound layer using an organic compound with high surface tension is to be formed. Therefore, the first and second conductive layers can be surely short-circuited. Consequently, the conductivity of the memory element is different before and after voltage application, and properties of the memory element are not varied and become stable; therefore, normal writing can be carried out.

In this embodiment mode, an insulating layer provided so as to have contact with an organic compound layer has low (bad) wettability against an organic compound material. Further, the organic compound material has higher surface tension than the insulating layer. Therefore, in the case where the organic compound material goes into a liquid state, it easily aggregates and has bad wettability against a region to be formed. Therefore, as described in this embodiment mode, when a material having low wettability against an organic compound material is low is used for an insulating layer, aggregation of the organic compound material is further promoted on the surface of the insulating layer and the organic compound layer is transformed.

On the other hand, a high heat resistant and stable mixed layer of an organic compound and an inorganic compound can be obtained by mixing an inorganic compound such as metal oxide or metal nitride with an organic compound. This is because the organic compound and the inorganic compound may be firmly attached to each other as the molecular level. Therefore, even when an organic compound material is heated so as to be melted, goes into a fluid liquid state, and aggregates to be transformed into a ball shape due to surface tension, the organic compound may be prevented from being transformed because it is firmly attached to an inorganic compound at the molecular level. When such a stable mixed layer is provided between the first and second conductive layers of a memory element, an organic compound layer is not easily transformed since the aggregation of the organic compound is prevented due to the high adhesiveness between the organic compound and the inorganic compound. Besides, an insulator stably exists between the first and second conductive layers since the inorganic compound is also an insulator. Therefore, the first and second conductive layers may be prevented from being short-circuited. That is to say, when the organic compound layer is formed so as to cover the mixed layer of the organic compound and the inorganic compound after the first conductive layer is formed, even if the mixed layer is thin film, it can be considered that the first and second conductive layers cannot be easily short-circuited. Accordingly, when there is only the organic compound as shown in this embodiment mode, the organic compound aggregates due to surface tension after being melted by heat. Therefore, the organic compound layer exists discontinuously. Consequently, the first and second conductive layers have contact with each other and are short-circuited in a region where the organic compound does not exist.

In this embodiment mode, the insulating layer has an insulation property. The insulating layer may be a very thin film (the film thickness of the insulating layer is 4 nm or less, more preferably, 1 nm or more and 2 nm or less), and depending on a material and a manufacturing method of the insulating layer, the insulating layer may have not a shape as a continuous film but a discontinuous island-like shape. In other drawings in this specification, the insulating layer is shown as a continuous layer, the insulating layer may also be a discontinuous island-like shape. The insulating layer which is formed at an interface between the conductive layer and the organic compound layer allows the tunnel injection of carriers; therefore, a tunnel current flows. Accordingly, when a voltage is applied between the first and second conductive layers, a current flows to the organic compound layer; thereby generating heat. When the temperature of the organic compound layer rises to its glass-transition temperature, the material for forming the organic compound layer turns into a fluid composition. Because of the surface tension of the composition (organic compound material) and bad wettability against a surface of the insulating layer which is a formation substance, the fluid composition aggregates so as to flow (move) without maintaining the shape in a solid state, and change the shape. Consequently, the thickness of the organic compound layer becomes uneven and the organic compound layer is transformed, and the first and second conductive layers are partially brought into contact with each other, and surely short-circuited. As a result, the conductivity of the memory element is different before and after voltage application.

As a result, properties of the memory element, such as a writing voltage, are not varied and become stable; therefore, normal writing to each element can be carried out. Further, since a carrier injecting property is improved by a tunnel current in the insulating layer, the thickness of the organic compound layer can be increased. Accordingly, a defect that the memory element is short-circuited in an initial state before electrical conduction can be prevented.

Note that a voltage applied to the first conductive layer of the memory element of the invention may be higher than that applied to the second conductive layer of the memory element. Alternatively, a voltage applied to the second conductive layer may be higher than that applied to the first conductive layer. In the case where the memory element has a rectifying property, a potential difference may be provided between the first and second conductive layers so that either a forward bias voltage or a reverse bias voltage is applied to the memory element.

Figure 3:
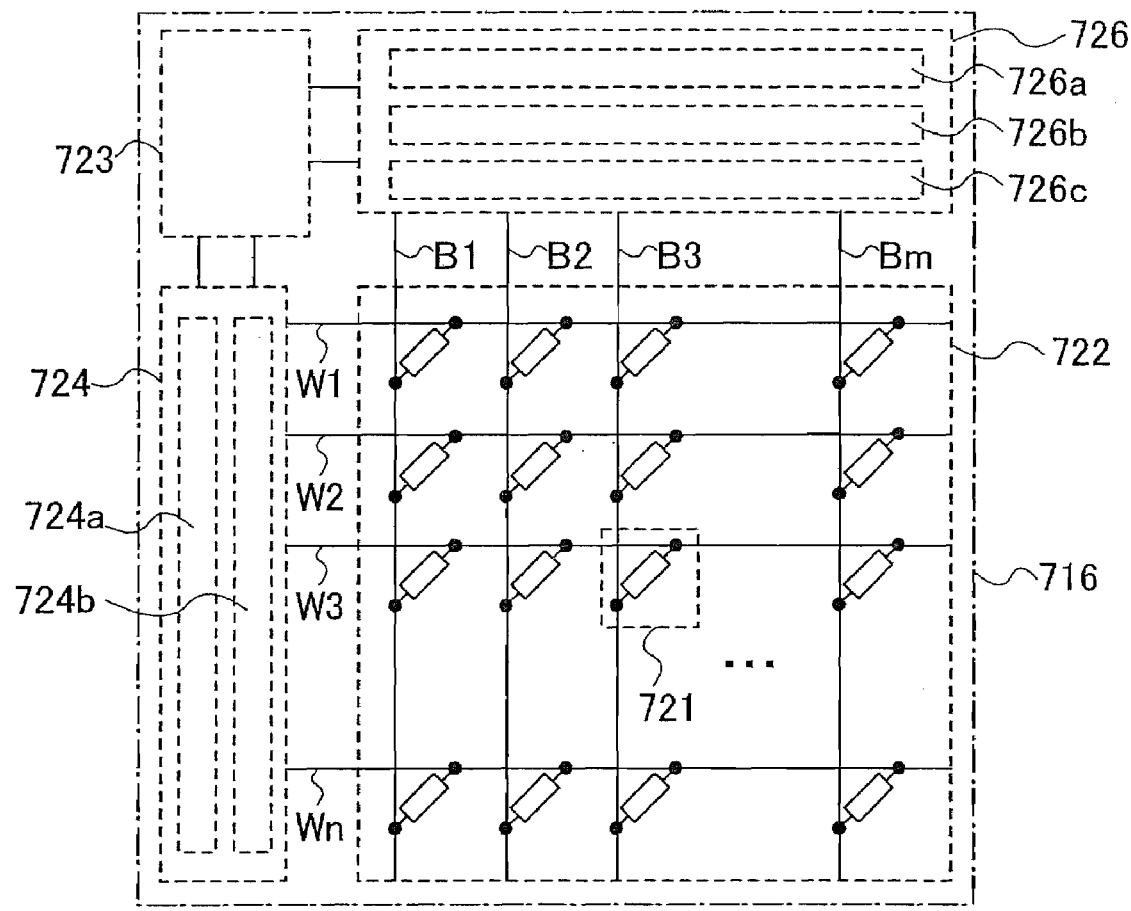
FIG. 3 is a diagram showing a memory device of the invention.

One configuration example of a memory device of the invention is shown in FIG. 3. The configuration example has a memory cell array 722 in which memory cells 721 are provided in matrix, a bit line driver circuit 726 having a column decoder 726a, a reading circuit 726b, and a selector 726c, a word line driver circuit 724 having a row decoder 724a and a level shifter 724b and an interface 723 which includes a writing circuit and the like and carries out interactions with the outside. Note that the configuration of a memory device 716 shown here is only one example and the memory device may have another circuit such as a sense amplifier, an output circuit, and a buffer, and the writing circuit may be provided in the bit line driver circuit.

The memory cell 721 has a first conductive layer which constitutes a word line Wy ($1 \leq y \leq n$), a second conductive layer which constitutes a bit line Bx ($1 \leq x \leq m$), and an organic compound layer. The organic compound layer is provided as a single layer or as stacked layers between the first and second conductive layers.

Figure 2A:
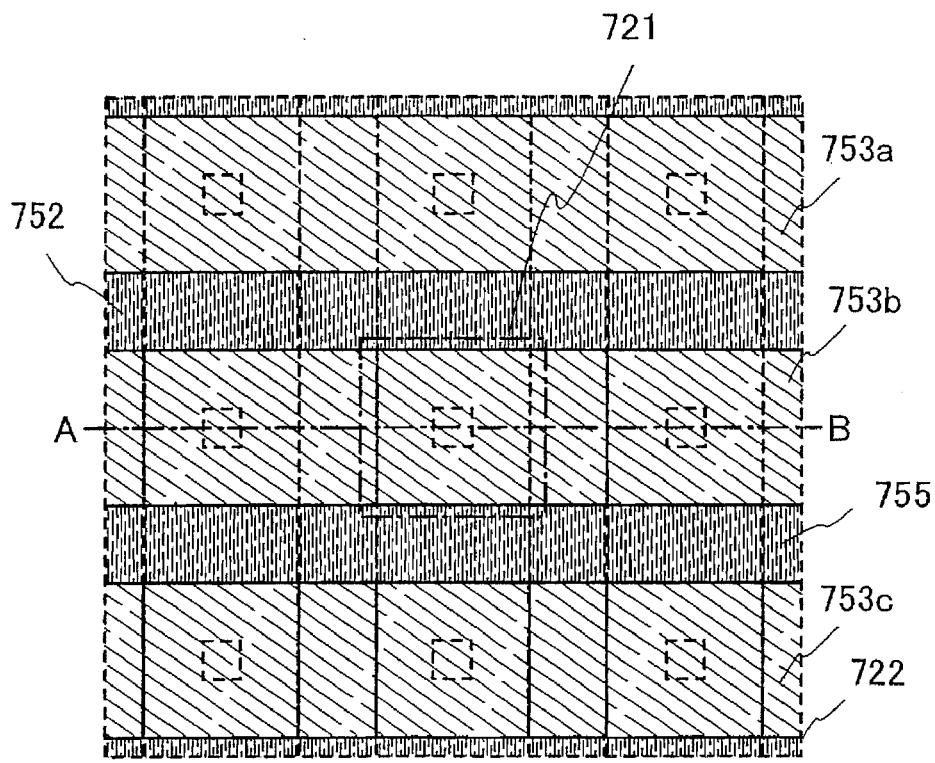
FIGS. 2A to 2C are diagrams showing a memory device of the invention.
Figure 2B:
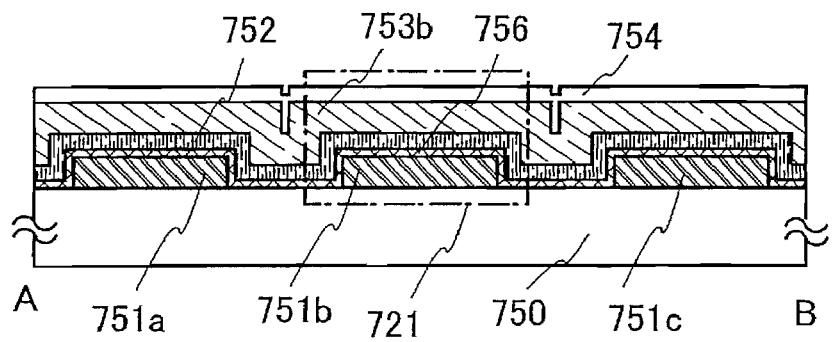
Figure 2C:
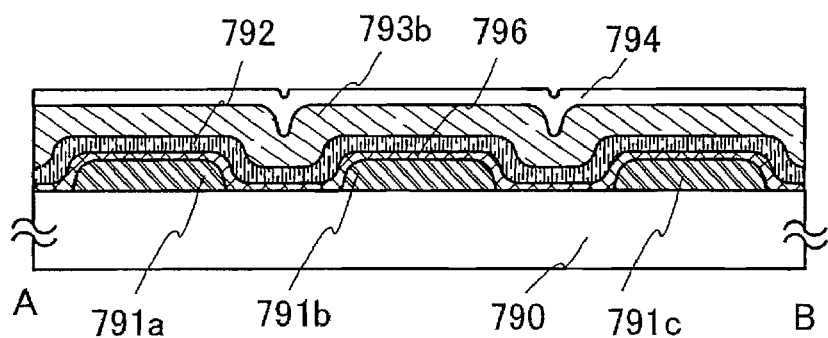

A top plan view of the memory cell array 722 is shown in FIG. 2A, and cross-sectional views along a line A-B in FIG. 2A are shown in FIG. 2B and in FIG. 2C. Note that in FIG. 2A, an insulating layer 754 is not shown, but it is provided as shown in FIG. 2B.

The memory cell array 722 has first conductive layers 751a, 751b, and 751c, and a partition (insulating layer) 755 that extend in a first direction; an organic compound layer 752 that is provided so as to cover the first conductive layers 751a, 751b, and 751c and the partition (insulating layer) 755; and second conductive layers 753a, 753b, and 753c that extend in a second direction which is perpendicular to the first direction (see FIG. 2A). The organic compound layer 752 is provided between the first conductive layers 751a, 751b, and 751c, and the second conductive layers 753a, 753b, and 753c. Further, the insulating layer 754 serving as a protective film is provided so as to cover the second conductive layers 753a, 753b, and 753c (see FIG. 2B). An insulating layer 756 and the organic compound layer 752 are formed in this order over the first conductive layers 751a, 751b, and 751c. Note that in the case where there is concern for an effect of an electric field in the lateral direction between memory cells that are adjacent to one another, the organic compound layer 752 that is provided for each memory cell may be separated. Further, the insulating layer 756 may be separated per memory cell as well.

FIG. 2C is a modification example of FIG. 2B, and has first conductive layers 791a, 791b, and 791c, an organic compound layer 792, a second conductive layer 793b, and an insulating layer 794 which is a protective layer, over a substrate 790. An insulating layer 796 and an organic compound layer 792 are formed in this order over the first conductive layers 791a, 791b, and 791c. As the first conductive layers 791a, 791b, and 791c in FIG. 2C, the first conductive layer may have a tapered end portion and a shape in which the curvature radius changes continuously. Such a shape as the first conductive layers 791a, 791b, and 791c can be formed by using a droplet discharge method or the like. When the curved surface of the first conductive layer has such curvature, the coverage of an organic compound layer and a conductive layer that are to be stacked is good.

Figure 8A:
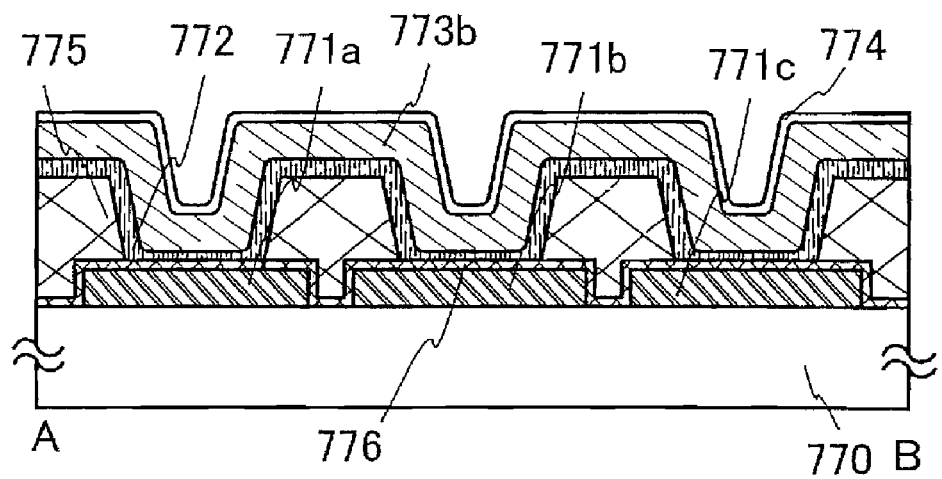
FIGS. 8A and 8B are diagrams showing a memory device of the invention.
Figure 8B:
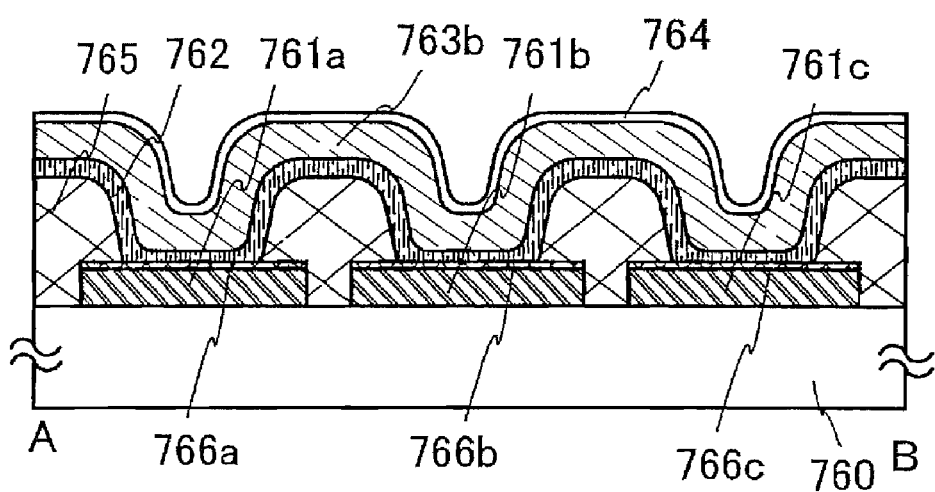

Further, a partition (insulating layer) may be formed so as to cover an end portion of the first conductive layer. The partition (insulating layer) serves as a wall separating one memory element from another. FIGS. 8A and 8B show structures in which the end portion of the first conductive layer is covered with the partition (insulating layer).

FIG. 8A shows an example in which an insulating layer 776 is formed between first conductive layers 771a, 771b, and 771c, and an organic compound layer 772. In this embodiment mode, a partition (insulating layer) 775 is formed in a tapered shape so as to cover each end portion of the first conductive layers 771a, 771b, and 771c. The partition (insulating layer) 775, the organic compound layer 772, a second conductive layer 773b, an insulating layer 774 are formed in this order over the first conductive layers 771a, 771b, and 771c, and the insulating layer 776 that are provided over a substrate 770.

In a memory device shown in FIG. 8B, a partition (insulating layer) 765 has curvature and a shape in which the curvature radius changes continuously. Insulating layers 766a, 766b, and 766c are formed over the first conductive layers 761a, 761b, and 761c, respectively. As shown in FIG. 8B, the insulating layer may be separated per memory element. An organic compound layer 762, a second conductive layer 763b, and an insulating layer 764 are formed in this order over the first conductive layers 761a, 761b, and 761c, and the insulating layers 766a, 766b, and 766c that are provided over the substrate 760.

In the invention, an insulating layer is formed by using an inorganic insulator or an organic compound which is stable thermally and chemically and to which carriers are not injected. An insulator mixed in an organic compound layer preferably has an electric conductivity of $10^{-10}$ s/m or less, more preferably, $10^{-10}$ s/m or more and $10^{-14}$ s/m or less. Examples of an inorganic insulator and an organic compound which can be used for an insulating layer are described below.

In the invention, as an inorganic insulator which can be used for an insulating layer, oxide can be used, such as lithium oxide ($Li_2O$), sodium oxide ($Na_2O$), potassium oxide ($K_2O$), rubidium oxide ($Rb_2O$), beryllium oxide (BeO), magnesium oxide (MgO), calcium oxide (CaO), strontium oxide (SrO), barium oxide (BaO), scandium oxide ($Sc_2O_3$), zirconium oxide ($ZrO_2$), hafnium oxide ($HfO_2$), rutherfordium oxide ($RfO_2$), tantalum oxide (TaO), technetium oxide (TcO), iron oxide ($Fe_2O_3$), cobalt oxide (CoO), palladium oxide (PdO), silver oxide ($Ag_2O$), aluminum oxide ($Al_2O_3$), gallium oxide ($Ga_2O_3$), or bismuth oxide ($Bi_2O_3$).

In the invention, as another inorganic insulator which can be used for an insulating layer, fluoride can be used, such as lithium fluoride (LiF), sodium fluoride (NaF), potassium fluoride (KF), rubidium fluoride (RbF), beryllium fluoride ($BeF_2$), magnesium fluoride ($MgF_2$), calcium fluoride ($CaF_2$), strontium fluoride ($SrF_2$), barium fluoride ($BaF_2$), aluminum fluoride ($AlF_3$), nitrogen trifluoride ($NF_3$), sulfur hexafluoride ($SF_6$), silver fluoride (AgF), or manganese fluoride ($MnF_3$).

In the invention, as another inorganic insulator which can be used for an insulating layer, chloride can be used, such as lithium chloride (LiCl), sodium chloride (NaCl), potassium chloride (KCl), beryllium chloride ($BeCl_2$), calcium chloride ($CaCl_2$), barium chloride ($BaCl_2$), aluminum chloride ($AlCl_3$), silicon chloride ($SiCl_4$), germanium chloride ($GeCl_4$), tin chloride ($SnCl_4$), silver chloride (AgCl), zinc chloride (ZnCl), titanium tetrachloride ($TiCl_4$), titanium trichloride ($TiCl_3$), zirconium chloride ($ZrCl_4$), iron chloride ($FeCl_3$), palladium chloride ($PdCl_2$), antimony trichloride ($SbCl_3$), antimony dichloride ($SbCl_2$), strontium chloride ($SrCl_2$), thallium chloride (TlCl), copper chloride (CuCl), manganese chloride ($MnCl_2$), or ruthenium chloride ($RuCl_2$).

In the invention, as another inorganic insulator which can be used for an insulating layer, bromide can be used, such as potassium bromide (KBr), cesium bromide (CsBr), silver bromide (AgBr), barium bromide ($BaBr_2$), silicon bromide ($SiBr_4$), or lithium bromide (LiBr).

In the invention, as another inorganic insulator which can be used for an insulating layer, iodide can be used, such as sodium iodide (NaI), potassium iodide (KI), barium iodide ($BaI_2$), thallium iodide (TlI), silver iodide (AgI), titanium iodide ($TiI_4$), calcium iodide ($CaI_2$), silicon iodide ($SiI_4$), or cesium iodide (CsI).

In the invention, as another inorganic insulator which can be used for an insulating layer, carbonate can be used, such as lithium carbonate ($Li_2CO_3$), potassium carbonate ($K_2CO_3$), sodium carbonate ($Na_2CO_3$), magnesium carbonate ($MgCO_3$), calcium carbonate ($CaCO_3$), strontium carbonate ($SrCO_3$), barium carbonate ($BaCO_3$), manganese carbonate ($MnCO_3$), iron carbonate ($FeCO_3$), cobalt carbonate ($CoCO_3$), nickel carbonate ($NiCO_3$), copper carbonate ($CuCO_3$), silver carbonate ($Ag_2CO_3$), or zinc carbonate ($ZnCO_3$).

In the invention, as another inorganic insulator which can be used for an insulating layer, sulfate can be used, such as lithium sulfate ($Li_2SO_4$), potassium sulfate ($K_2SO_4$), sodium sulfate ($Na_2SO_4$), magnesium sulfate ($MgSO_4$), calcium sulfate ($CaSO_4$), strontium sulfate ($SrSO_4$), barium sulfate ($BaSO_4$), titanium sulfate ($Ti_2(SO_4)_3$), zirconium sulfate ($Zr(SO_4)_2$), manganese sulfate ($MnSO_4$), iron sulfate ($FeSO_4$), ferric trisulfate ($Fe_2(SO_4)_3$), cobalt sulfate ($CoSO_4$), cobalt sulfate ($Co_2(SO_4)_3$), nickel sulfate ($NiSO_4$), copper sulfate ($CuSO_4$), silver sulfate ($Ag_2SO_4$), zinc sulfate ($ZnSO_4$), aluminium sulfate ($Al_2(SO_4)_3$), indium sulfate ($In_2(SO_4)_3$), tin sulfate ($SnSO_4$), tin sulfate ($Sn(SO_4)_2$), antimony sulfate ($Sb_2(SO_4)_3$), or bismuth sulfate ($Bi_2(SO_4)_3$).

In the invention, as another inorganic insulator which can be used for an insulating layer, nitrate can be used, such as lithium nitrate ($LiNO_3$), potassium nitrate ($KNO_3$), sodium nitrate ($NaNO_3$), magnesium nitrate ($Mg(NO_3)_2$), calcium nitrate ($Ca(NO_3)_2$), strontium nitrate ($Sr(NO_3)_2$), barium nitrate ($Ba(NO_3)_2$), titanium nitrate ($Ti(NO_3)_4$), strontium nitrate ($Sr(NO_3)_2$), barium nitrate ($Ba(NO_3)_2$), zirconium nitrate ($Zr(NO_3)_4$), manganese nitrate ($Mn(NO_3)_2$), iron nitrate ($Fe(NO_3)_2$), iron nitrate ($Fe(NO_3)_3$), cobalt nitrate ($Co(NO_3)_2$), nickel nitrate ($Ni(NO_3)_2$), copper nitrate ($Cu(NO_3)_2$), silver nitrate ($AgNO_3$), zinc nitrate ($Zn(NO_3)_2$), aluminum nitrate ($Al(NO_3)_3$), indium nitrate ($In(NO_3)_3$), tin nitrate ($Sn(NO_3)_2$), or bismuth nitrate ($Bi(NO_3)_3$).

In the invention, as another inorganic insulator which can be used for an insulating layer, nitride such as aluminum nitride (AlN) or silicon nitride (SiN), or carboxylate such as lithium carboxylate ($LiCOOCH_3$), potassium acetate ($KCOOCH_3$), sodium acetate ($NaCOOCH_3$), magnesium acetate ($Mg(COOCH_3)_2$), calcium acetate ($Ca(COOCH_3)_2$), strontium acetate ($Sr(COOCH_3)_2$), or barium acetate ($Ba(COOCH_3)_2$) can be used.

In the invention, one or a plurality of the aforementioned inorganic insulators can be used for an insulating layer.

In the invention, an organic compound having a band gap of 3.5 eV or more, more preferably, 4 eV or more and 6 eV or less, to which carriers are not easily injected, can be used for an insulating layer. For example, polyimide, acrylic, polyamide, benzocyclobutene, polyester, novolac resin, melamine resin, phenol resin, epoxy resin, silicon resin, franc resin, diallyl phthalate resin, or siloxane resin can be used.

In the invention, one or a plurality of the aforementioned organic compounds can be used for an insulating layer.

In the invention, an insulating layer can be formed by using one or a plurality of the aforementioned inorganic insulators and organic compounds. In the invention, an insulating layer has an insulating property.

The insulating layer can be formed using an evaporation method such as co-evaporation, an application method such as a spin coating method, and a sol-gel method. Further, a droplet discharge (eject) method (also referred to as an ink jet method depending on its mode) capable of forming into a predetermined pattern by selectively discharging (ejecting) a droplet of a composition mixed for a particular purpose; a method capable of transferring or drawing an object into a desired pattern, for example, various printing methods (a method for forming into a desired pattern, such as screen (mimeograph) printing, offset (lithography) printing, relief printing, or gravure (intaglio) printing) can be used.

For the substrates 750, 760, 770, and 780 in the aforementioned structures of the memory cell, a quartz substrate, a silicon substrate, a metal substrate, a stainless substrate, or the like can be used other than a glass substrate or a flexible substrate. A flexible substrate is a substrate that can be bent (flexible). For example, a plastic substrate made of polycarbonate, polyalylate, polyethersulfone, or the like can be given. Further, a laminating film (made of polypropylene, polyester, vinyl, polyvinyl fluoride, polyvinyl chloride, or the like), paper made of a fibrous material, a base film (such as polyester, polyamide, inorganic deposition film, and paper), and the like can be used. In addition, the memory cell array 722 can be provided above a field effect transistor (PET) that is formed over a semiconductor substrate such as Si, or above a thin film transistor (TFT) that is formed over a glass substrate or the like.

For the first conductive layers 751a to 751c; the first conductive layers 761a to 761c; the first conductive layers 771a to 771c; the first conductive layers 791a to 791c; the second conductive layers 753a to 753c; the second conductive layers 763a to 763c; the second conductive layers 773a to 773c; and the second conductive layers 793a to 793c, a highly conductive element or compound, or the like is used. Typically, a single layer or stacked layers of a single type of element or an alloy containing a plurality of elements selected from the following can be used: gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like. As an alloy containing a plurality of the elements mentioned above, for example, an alloy containing Al and Ti; an alloy containing Al, Ti and C; an alloy containing Al and Ni; an alloy containing Al and C; an alloy containing Al, Ni and C; an alloy containing Al and Mo, or the like can be used.

The first conductive layers 751a to 751c; the first conductive layers 761a to 761c; the first conductive layers 771a to 771c; the first conductive layers 791a to 791c; the second conductive layers 753a to 753c; the second conductive layers 763a to 763c; the second conductive layers 773a to 773c; and the second conductive layers 783a to 783c, can be formed using an evaporation method, a sputtering method, a CVD method, a printing method, or a droplet discharge method.

Among the first conductive layers 751a to 751c; the first conductive layers 761a to 761c; the first conductive layers 771a to 771c; the first conductive layers 791a to 791c; the second conductive layers 753a to 753c; the second conductive layers 763a to 763c; the second conductive layers 773a to 773c; and the second conductive layers 793a to 793c; either the first conductive layers or the second conductive layers, or both of them may be provided so as to have light transmissivity. A conductive layer having light transmissivity is formed using a transparent conductive material, or if a transparent conductive material is not used, the conductive layer having light transmissivity is formed with a thickness that allows light to transmit. As the transparent conductive material, oxide conductive materials that have light transmissivity such as indium tin oxide (ITO), zinc oxide (ZnO), indium zinc oxide (IZO), and gallium added zinc oxide (GZO), and the like can be used. An oxide conductive material that is formed using a target in which 2 to 20 wt % of zinc oxide (ZnO) is mixed with ITO, indium tin oxide containing silicon oxide (hereinafter referred to as ITSO), or indium oxide containing silicon oxide may be used.

The organic compound layers 752, 762, 772, and 792 are formed with an organic compound in which the conductivity changes by an electrical effect. The organic compound layers 752, 762, 772, and 792 may be provided in a single layer or by stacking a plurality of layers. Further, they may be provided by stacking layers formed with an organic compound in which the conductivity changes by an electrical effect.

As an organic compound that can form the organic compound layers 752, 762, 772, and 792, an organic resin represented by polyimide, acrylic, polyamide, benzocyclobutene, epoxy, or the like can be used.

As an organic compound that can form the organic compound layers 752, 762, 772, and 792, in which the conductivity changes by an electrical effect, an organic compound material having a hole-transporting property, or an organic compound material having an electron-transporting property can be used.

As the organic compound material having a hole-transporting property, an aromatic amine compound (in other words, having a benzene ring-nitrogen bond) such as 4,4'-bis[N-(1-naphthyl)-N-phenyl-amino]-biphenyl (abbreviated: α-NPD); 4,4'-bis[N-(3-methylphenyl)-N-phenyl-amino]-biphenyl (abbreviated: TPD); 4,4',4''-tris(N,N-diphenyl-amino)-triphenylamine (abbreviated: TDATA): 4,4',4''-tris[N-(3-methylphenyl)-N-phenyl-amino]-triphenylamine (abbreviated: MTDATA); and 4,4'-bis(N-(4-(N,N-di-m-tolylamino)phenyl)-N-phenylamino)biphenyl (abbreviated: DNTPD), or a phthalocyanine compound such as phthalocyanine (abbreviated: $H_2Pc$), copper phthalocyanine (abbreviated: CuPc), and vanadyl phthalocyanine (abbreviated: VOPc) can be used. The substances mentioned here are mainly substances having a hole mobility of $10^{-6}$ $cm^2/Vs$ or more, more preferably, $10^{-6}$ $cm^2/Vs$ or more and $10^{-2}$ $cm^2/Vs$ or less.

As the organic compound material having an electron-transporting property, a material made of a metal complex having a quinoline skeleton or a benzoquinoline skeleton such as tris(8-quinolinolato)aluminum (abbreviated: $Alq_3$), tris(4-methyl-8-quinolinolato)aluminum (abbreviated: $Almq_3$), bis(10-hydroxybenzo[h]-quinolinato)beryllium (abbreviated: $BeBq_2$), and bis(2-methyl-8-quinolinolato)-4-phenylphenolato-aluminum (abbreviated: BAlq), or the like can be used. Further, a material made of a metal complex having an oxazole based or thiazole based ligand such as bis[2-(2-hydroxyphenyl)benzoxazolato]zinc (abbreviated: $Zn(BOX)_2$), and bis[2-(2-hydroxyphenyl)benzothiazolato]zinc (abbreviated: $Zn(BTZ)_2$) can be used. Furthermore, other than a metal complex, 2-(4-biphenylyl)-5-(4-tert-butylphenyl)-1,3,4-oxadiazole (abbreviated: PBD); 1,3-bis[5-(p-tert-butylphenyl)-1,3,4-oxadiazole-2-yl]benzene (abbreviated: OXD-7); 3-(4-tert-butylphenyl)-4-phenyl-5-(4-biphenylyl)-1,2,4-triazole (abbreviated: TAZ); 3-(4-tert-butylphenyl)-4-(4-ethylphenyl)-5-(4-biphenylyl)-1,2,4-triazole (abbreviated: p-EtTAZ); bathophenanthroline (abbreviated: BPhen), bathocuproin (abbreviated: BCP), or the like can be used. The substances mentioned here are mainly substances having an electron mobility of $10^{-6}$ $cm^2/Vs$ or more, more preferably, $10^{-6}$ $cm^2/Vs$ or more and $10^{-2}$ $cm^2/Vs$ or less.

In the invention, one or a plurality of the aforementioned organic compound materials can be used for an organic compound layer.

The organic compound layers 752, 762, 772 and 792 can be formed using an evaporation method, an electron beam evaporation method, a sputtering method, a CVD method, or the like. In the case of using a plurality of materials, the organic compound layer can be formed by simultaneously depositing each of the materials. It can be formed by combining the same method or different kinds of methods, such as co-evaporation by resistance heating evaporation, co-evaporation by electron beam evaporation, co-evaporation by resistance heating evaporation and electron beam evaporation, deposition by resistance heating evaporation and sputtering, and deposition by electron beam evaporation and sputtering.

Note that the organic compound layers 752, 762, 772, and 792 are formed with such a film thickness that the conductivity of the memory element changes by an electrical effect.

As the partitions (insulating layers) 765 and 775, an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular compound such as polyimide, aromatic polyimide, or polybenzimidazole; or a siloxane resin may be used. Note that the siloxane resin corresponds to a resin containing a Si—O—Si bond. The skeletal structure of siloxane is constituted by a bond between silicon (Si) and oxygen (O). As a substituent, an organic group containing at least hydrogen (for example, an alkyl group or an aromatic hydrocarbon) is used. As the substituent, a fluoro group may also be used. Alternatively, an organic group containing at least hydrogen, and a fluoro group may be used as the substituent. Further, a vinyl resin such as polyvinyl alcohol, or polyvinyl butyral; or a resin material such as epoxy resin, phenol resin, novolac resin, acrylic resin, melamine resin, or urethane resin is used. Further, an organic material such as benzocyclobutene, parylene, fluorinated-arylene-ether, or polyimide, or a composition material containing a water-soluble homopolymer and a water-soluble copolymer may be used. As a manufacturing method, a vapor growth method such as a plasma CVD method or a thermal CVD method, or a sputtering method can be used. Further, a droplet discharge method or a printing method (a method for forming a pattern, such as screen printing or offset printing) can also be used. A TOF film, an SOG film, or the like which is obtained by a coating method can also be used.

After forming a conductive layer, an insulating layer, or the like by discharging a composition by the droplet discharge method, the surface may be pressed with pressure to be planarized, in order to increase planarity. As a method for pressing, unevenness can be reduced by scanning a roller-shaped object on the surface, or the surface may be pressed perpendicularly with a flat, plate-like object. At the time of pressing, a heating step may be carried out. Further, the surface may be softened or melted by flux or the like, and the unevenness portion of the surface may be removed with an air knife. Further, it may be polished using a CMP method. This step can be applied to planarize the surface when unevenness occurs as a result of a droplet discharge method.

Further, in the aforementioned structures of this embodiment mode, an element having a rectifying property may be provided between the first conductive layers 50, 60, and 70, the first conductive layers 751a to 751c, the first conductive layers 761a to 761c, the first conductive layers 771a to 771c, and the first conductive layers 791a to 791c, and the insulating layer 51, the organic compound layer 62, the insulating layer 71, the insulating layer 756, the insulating layers 766a and 766b, the insulating layer 776, and insulating layer 796, respectively. The element having a rectifying property is a transistor in which a gate electrode and a drain electrode are connected, or a diode. In this manner, by providing the diode having a rectifying property, errors are reduced and a reading margin is improved since a current flows in only one direction. Note that the element having a rectifying property may be provided between the organic compound layer 52, the organic compound layer 62, the organic compound layer 72, the organic compound layer 752, the organic compound layer 762, the organic compound layer 772, and the organic compound layer 792, and the second conductive layer 53, the second conductive layer 63, the second conductive layer 73, the second conductive layers 753a to 753c, the second conductive layers 763a to 763c, the second conductive layers 773a to 773c, and the second conductive layers 793a to 793c, respectively.

By using the memory element of the invention, properties of the memory element, such as a writing voltage are not varied and become stable; therefore, normal writing can be surely carried out in each element. Further, since a carrier injecting property is improved by a tunnel current in the insulating layer, the thickness of the organic compound layer can be increased. Accordingly, a defect that the memory element is short-circuited in an initial state before electrical conduction can be prevented. As a result, a memory device and a semiconductor device with high reliability can be provided with high yield.

Embodiment Mode 2

In this embodiment mode, a memory device having a structure different from that of Embodiment Mode 1 is described. Specifically, a structure of an active matrix memory device is described.

Figure 5:
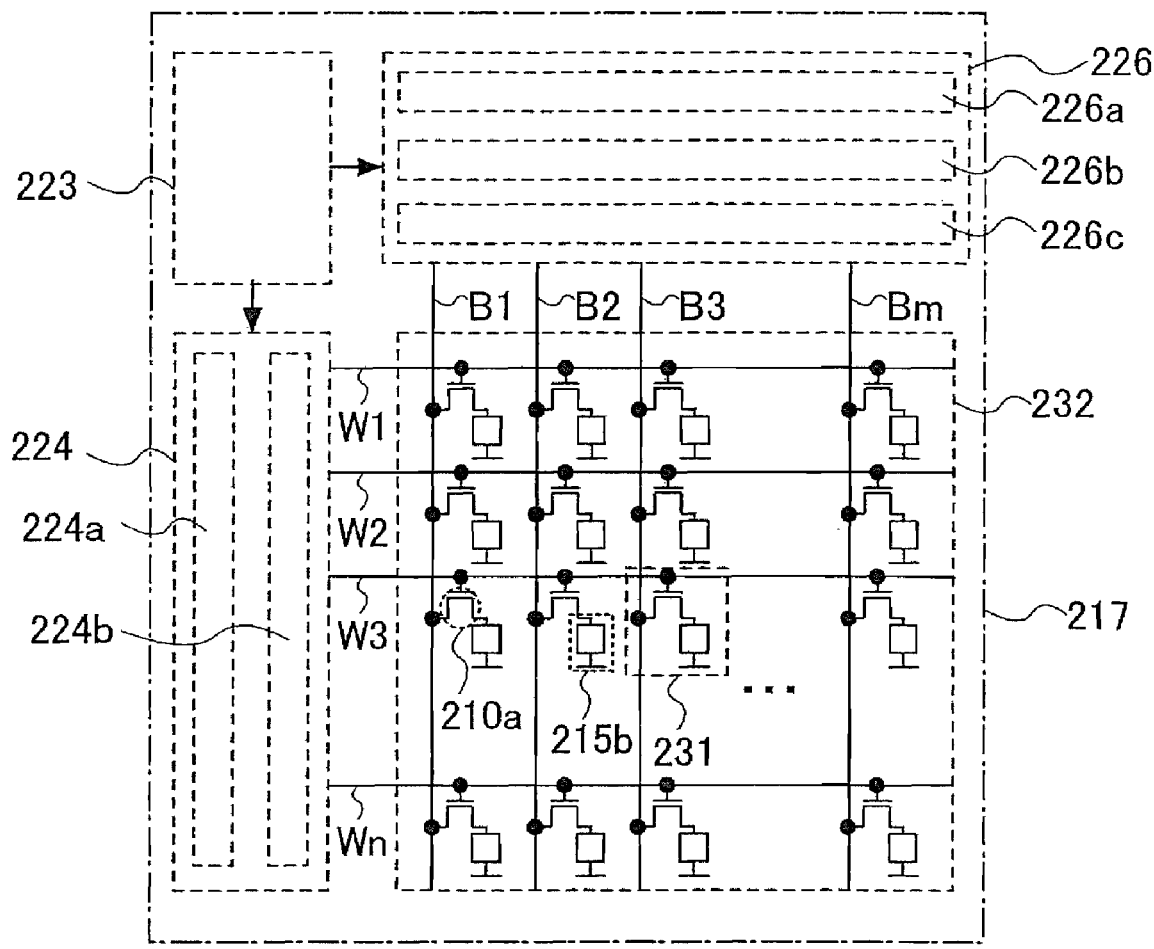
FIG. 5 is a diagram showing a memory device of the invention.

FIG. 5 shows one configuration example of the memory device that is described in this embodiment mode, which includes a memory cell array 232 in which memory cells 231 are provided in matrix; a bit line driver circuit 226 that has a column decoder 226a, a reading circuit 226b, and a selector 226c; a word line driver circuit 224 that has a row decoder 224a and a level shifter 224b; and an interface 223 that carries out interactions with the outside and has a writing circuit and the like. Note that the configuration of a memory device 217 shown here is only one example, and it may include another circuit such as a sense amplifier, an output circuit, or a buffer, and the writing circuit may be provided in the bit line driver circuit.

The memory cell 231 has a first wire that constitutes a word line Wy ($1 \leq y \leq n$), a second wire that constitutes bit line Bx ($1 \leq x \leq m$), a transistor 210a, and a memory element 215b. The memory element 215b has a structure in which an organic compound layer is interposed between a pair of conductive layers.

Figure 4A:
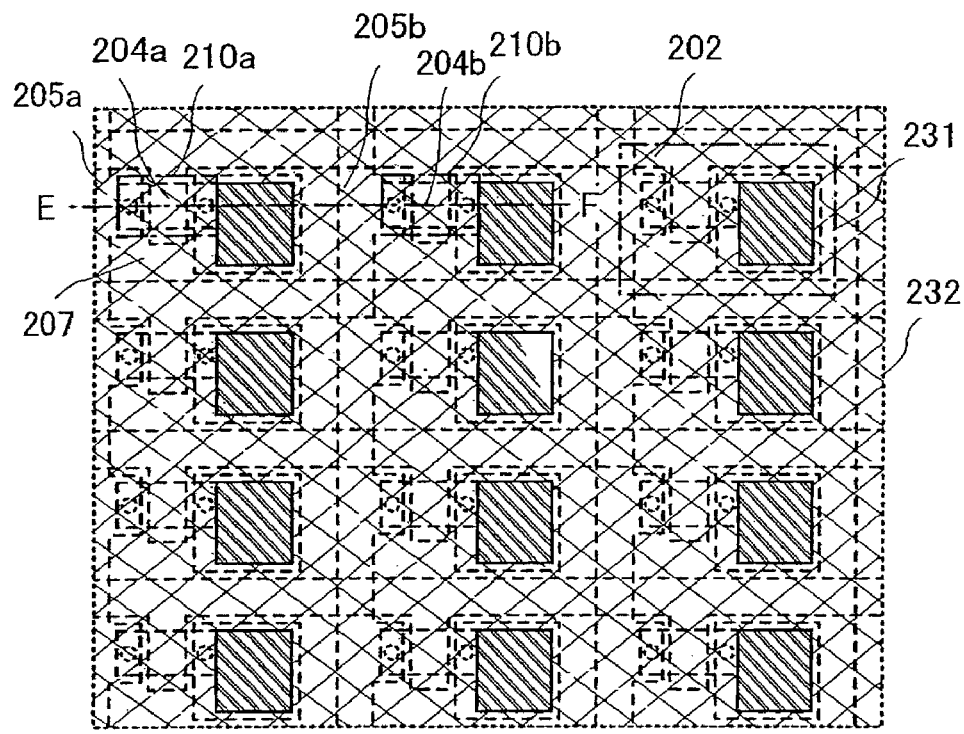
FIGS. 4A and 4B are diagrams showing a memory device of the invention.
Figure 4B:
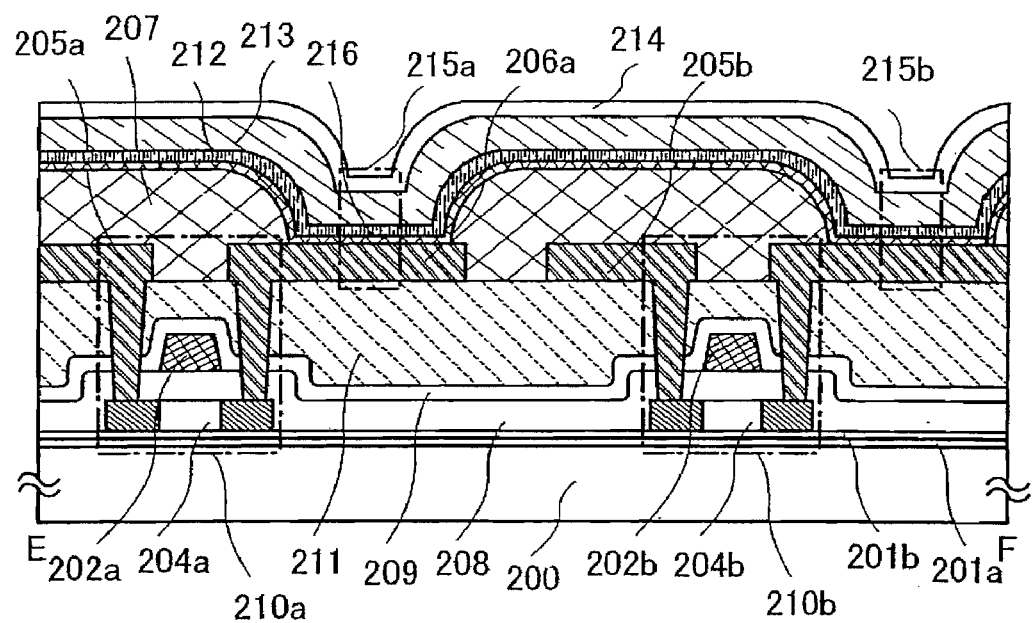

A top plan view of the memory cell array 232 is shown in FIG. 4A, and a cross-sectional view along a line E-F in FIG. 4A is shown in FIG. 4B. Further, an insulating layer 216, an organic compound layer 212, a second conductive layer 213, and an insulating layer 214 are omitted and not shown in FIG. 4A, but they are each provided as shown in FIG. 4B.

In the memory cell array 232, first wires 205a and 205b which extend in a first direction, and a second wire 202 which extends in a second direction that is perpendicular to the first direction, are provided in matrix. Further, the first wires are connected to source or drain electrodes of the transistor 210a and a transistor 210b, and the second wire is connected to gate electrodes of the transistors 210a and 210b. First conductive layers 206a and 206b are connected to source or drain electrodes of the transistors 210a and 210b, which are not connected to the first wires. Further, a memory element 215a and a memory element 215b are provided by stacking first conductive layers 206a and 206b, the insulating layer 216, the organic compound layer 212, and the second conductive layer 213. A partition (insulating layer) 207 is provided between each of the memory cells 231, which are adjacent to one another, and the organic compound layer 212 and the second conductive layer 213 are stacked over the first conductive layers and the partition (insulating layer) 207. The insulating layer 214 is provided as a protective layer over the second conductive layer 213. Further, as the transistors 210a and 210b, thin film transistors are used (see FIG. 4B).

A memory device in FIG. 4B is provided over a substrate 200 and has insulating layers 201a, 201b, 208, 209, and 211; a semiconductor layer 204a which constitutes the transistor 210a; a gate electrode layer 202a; a first wire 205a which is also used as a source electrode layer or a drain electrode layer; a semiconductor layer 204b which constitutes the transistor 210b; and a gate electrode layer 202b. Although the insulating layer is formed before the partition is formed in FIG. 8 which is described in Embodiment Mode 1, this embodiment mode shows an example where the insulating layer 216 is formed after the partition (insulating layer) 207 is formed. In the invention, since it is only required to provide the insulating layer between the conductive layer and the organic compound layer, either the insulating layer or the partition may be formed in first. The insulating layer 216, the organic compound layer 212, and the second conductive layer 213 are formed in this order over the first conductive layers 206a and 206b, and the partition (insulating layer) 207. Although the insulating layer is provided between the first conductive layer and the organic compound layer in this embodiment mode, the insulating layer may be provided only between the organic compound layer and the second conductive layer as described in Embodiment Mode 1. Alternatively, the first conductive layer, the first insulating layer, the organic compound layer, the second insulating layer, and the second conductive layer may be stacked in this order so as to interpose the organic compound layer.

In this embodiment mode, the insulating layer has an insulation property. The insulating layer may be a very thin film (the film thickness of the insulating layer is 4 nm or less, more preferably, 1 nm or more and 2 nm or less), and depending on a material and a manufacturing method of the insulating layer, the insulating layer may have not a shape as a continuous film but a discontinuous island-like shape. The insulating layer 216 which is formed at an interface between the conductive layer and the organic compound layer allows the tunnel injection of carriers; therefore, a current stably flows to the organic compound layer 212. Accordingly, when a voltage is applied to the first conductive layers 206a and 206b and the second conductive layer 213, a current flows to the organic compound layer; thereby generating heat. When the temperature of the organic compound layer rises to its glass-transition temperature, the material for forming the organic compound layer turns into a fluid composition. Because of the surface tension of the composition (organic compound material) and bad wettability against a surface of the insulating layer which is a formation substance, the fluid composition aggregates so as to flow (move) without maintaining the shape in a solid state, and change the shape. Consequently, the thickness of the organic compound layer becomes uneven and the organic compound layer is transformed, and the first conductive layer and the second conductive layer are partially brought into contact with each other, and surely short-circuited. As a result, the conductivity of the memory element is different before and after voltage application.

As described in this embodiment mode, the transformation of the organic compound layer 212 can be promoted and the film thickness of the organic compound layer 212 can be made uneven by providing the insulating layer 216 having bad wettability against the organic compound layer 212 over the first conductive layers 206a and 206b over which the organic compound layer 212 using an organic compound with high surface tension is formed. Therefore, the first and second conductive layers can be further surely short-circuited. As a result, the conductivity of the memory element is different before and after voltage application.

Consequently, properties of the memory element, such as a writing voltage are not varied and become stable; therefore, normal writing can be surely carried out in each element. Further, since a carrier injecting property is improved by a tunnel effect in the insulating layer, the thickness of the organic compound layer can be increased. Accordingly, a defect that the memory element is short-circuited in an initial state before electrical conduction can be prevented.

Figure 6:
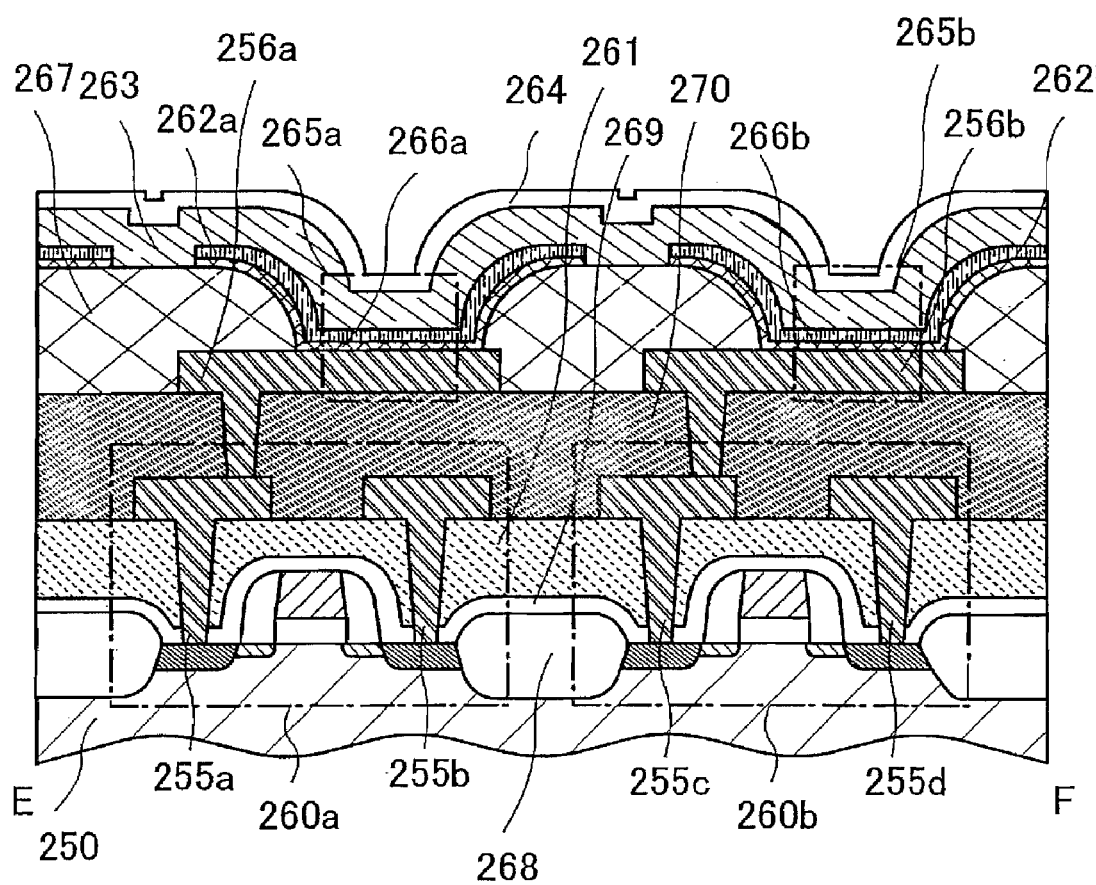
FIG. 6 is a diagram showing a memory device of the invention.

Further, as shown in FIG. 6, memory elements 265a and 265b may be connected to field effect transistors 260a and 260b respectively that are provided over a single crystalline semiconductor substrate 250. Here, the memory elements 265a and 265b are constituted such that an insulating layer 270 is provided so as to cover source electrode layers or drain electrode layers 255a to 255d of the field effect transistors 260a and 260b, and a first conductive layer 256a, a first conductive layer 256b, a partition (insulating layer) 267, insulating layers 266a and 266b, organic compound layers 262a and 262b, and a second conductive layer 263 are provided over the insulating layer 270. Like the insulating layers 266a and 266b and the organic compound layers 262a and 262b, the insulating layers and the organic compound layers may be selectively provided only for each memory cell using a mask or the like. Further, the memory device shown in FIG. 6 also has an element isolation region 268, and insulating layers 269, 261, and 264. The insulating layers 266a and 266b are formed over the first conductive layers 256a and 256b and the partition 267, and the organic compound layers 262a and 262b, and the second conductive layer 263 are formed over the insulating layers 266a and 266b. Although the insulating layer may be provided between the first conductive layer and the organic compound layer in this embodiment mode, the insulating layer may be provided only between the organic compound layer and the second conductive layer as described in Embodiment Mode 1. Alternatively, the first conductive layer, the first insulating layer, the organic compound layer, the second insulating layer, and the second conductive layer may be stacked in this order with the organic compound layer interposed therebetween.

In this embodiment mode, the insulating layers 266a and 266b have an insulation property. The insulating layers may be a very thin film (the film thickness of the insulating layer is 4 nm or less, more preferably, 1 nm or more and 2 nm or less), and depending on a material and a manufacturing method of the insulating layer, the insulating layer may have not a shape as a continuous film but a discontinuous island-like shape. The insulating layers 266a and 266b which are formed at an interface between the first conductive layers 256a and 256b and the organic compound layers 262a and 262b respectively allow the tunnel injection of carriers; therefore, a current stably flows to the organic compound layers 262a and 262b. Accordingly, when a voltage is applied to the first conductive layers 256a and 256b and the second conductive layer 263, the current flows to the organic compound layers 262a and 262b; thereby generating heat. When the temperature of the organic compound layers 262a and 262b rises to their glass-transition temperature, the material for forming the organic compound layers 262a and 262b turns into a fluid composition. Because of the surface tension of the composition (organic compound material) and bad wettability against a surface of the insulating layers 266a and 266b, the fluid composition aggregates so as to flow (move) without maintaining the shape in a solid state, and change the shape. Consequently, the thickness of the organic compound layers 262a and 262b becomes uneven and the organic compound layers 262a and 262b are transformed, and the first conductive layers 256a and 256b are partially brought into contact with the second conductive layer 263, which surely short-circuits the first conductive layers 256a and 256b and the second conductive layer 263. As a result, the conductivity of the memory element is different before and after voltage application.

As described in this embodiment mode, the transformation of the organic compound layers 262a and 262b is promoted and the film thickness of the organic compound layers 262a and 262b can be made uneven by providing the insulating layers 266a and 266b having bad wettability against the organic compound layers 262a and 262b over the first conductive layers 256a and 256b over which the organic compound layers 262a and 262b using an organic compound with high surface tension are formed. Therefore, the first conductive layers 256a and 256b and the second conductive layer 263 can be surely short-circuited. As a result, the conductivity of the memory element is different before and after voltage application.

Consequently, properties of the memory element, such as a writing voltage are not varied and become stable; therefore, normal writing can be surely carried out in each element. Further, since a carrier injecting property is improved by a tunnel effect in the insulating layer, the thickness of the organic compound layer can be increased. Accordingly, a defect that the memory element is short-circuited in an initial state before electrical conduction can be prevented.

In this manner, by forming the memory elements by providing the insulating layers 270, the first conductive layers can be freely disposed. In other words, in the structure in FIG. 4B, it is necessary to provide the memory elements 215a and 215b in regions where source electrode layers or drain electrode layers of the transistors 210a and 210b are not formed; however, according to the aforementioned structure, the memory elements 215a and 215b can be formed, for example, above the transistors 210a and 210b. As a result, higher integration of the memory device 217 becomes possible.

The transistors 210a and 210b may have any type of structure as long as they can serve as switching elements. Further, various semiconductors can be used for the semiconductor layer, such as an amorphous semiconductor, a crystalline semiconductor, a polycrystalline semiconductor, and a microcrystalline semiconductor, and an organic transistor may be formed using an organic compound. Although an example of providing a thin film transistor of a planar type over a substrate having an insulating property is shown in FIG. 4A, the transistor may have a staggered type or an inversely staggered type structure.

Figure 7:
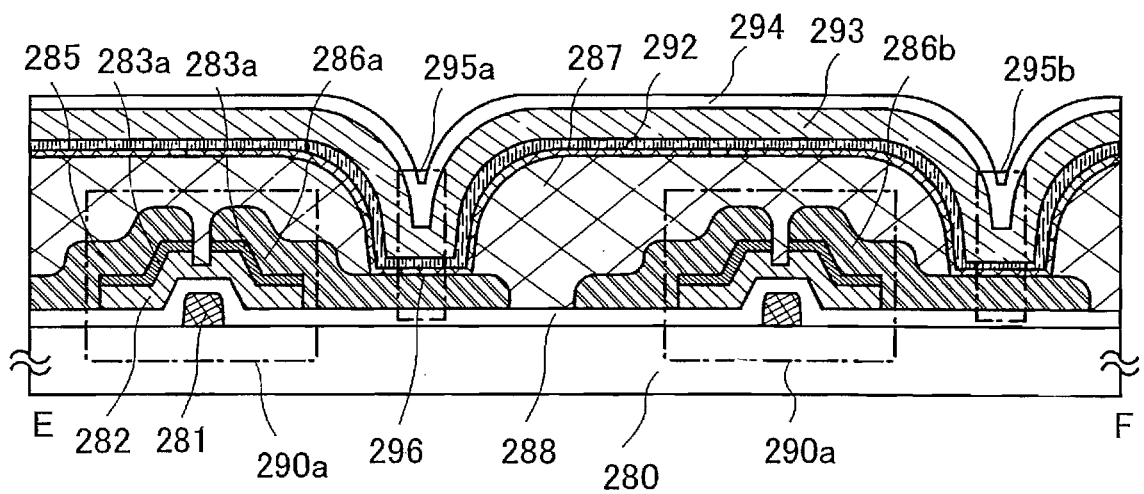
FIG. 7 is a diagram showing a memory device of the invention.

In FIG. 7, an example of using a thin film transistor with an inversely staggered type structure is shown. Transistors 290a and 290b that are thin film transistors of an inversely staggered type structure are provided over a substrate 280. The transistor 290a has an insulating layer 288, a gate electrode layer 281, an amorphous semiconductor layer 282, semiconductor layers 283a and 283b each having one conductivity type, and a source or drain electrode layer 285; and the source or drain electrode layer is a first conductive layer 286 which constitutes a memory element. Memory elements 295a and 295b are constituted by stacking a partition (insulating layer) 287 so as to cover end portions of the first conductive layers 286a and 286b, then forming an organic compound layer 292, a second conductive layer 293, and an insulating layer 294 which is a protective layer, over the first conductive layers 286a and 286b, and the partition (insulating layer) 287. Although the insulating layer may be provided between the first conductive layer and the organic compound layer in this embodiment mode, the insulating layer is provided only between the organic compound layer and the second conductive layer as described in Embodiment Mode 1. Alternatively, the first conductive layer, the first insulating layer, the organic compound layer, the second insulating layer, and the second conductive layer may be stacked in this order with the organic compound layer interposed therebetween.

In this embodiment mode, the insulating layer 296 has an insulation property. The insulating layer 296 may be a very thin film (the film thickness of the insulating layer is 4 nm or less, more preferably, 1 nm or more and 2 nm or less), and depending on a material and a manufacturing method of the insulating layer 296, the insulating layer 296 may have not a shape as a continuous film but a discontinuous island-like shape. The insulating layer 296 which is formed at an interface between the first conductive layers 286a and 286b and the organic compound layer 292 allows the tunnel injection of carriers; therefore, a current flows to the organic compound layer 292. Accordingly, when a voltage is applied to the first conductive layers 286a and 286b and the second conductive layer 293, a current flows to the organic compound layer 292; thereby generating heat. When the temperature of the organic compound layer 292 rises to its glass-transition temperature, the material for forming the organic compound layer 292 turns into a fluid composition. Because of the surface tension of the composition (organic compound material) and bad wettability against a surface of the insulating layer 296 which is a formation substance, the fluid composition aggregates so as to flow (move) without maintaining the shape in a solid state, and change the shape. Consequently, the thickness of the organic compound layer 292 becomes uneven and the organic compound layer 292 is transformed, and the first conductive layers 286a and 286b are partially brought into contact with the second conductive layer 293, which short-circuits the first conductive layers 286a and 286b and the second conductive layer 293. As a result, the conductivity of the memory element is different before and after voltage application.

As described in this embodiment mode, the transformation of the organic compound layer 292 is promoted and the film thickness of the organic compound layer 292 can be made uneven by providing insulating layers 296a and 296b having bad wettability against the organic compound layer 292 over the first conductive layers 286a and 286b over which the organic compound layer 292 using an organic compound with high surface tension is formed. Therefore, the first conductive layers 286a and 286b and the second conductive layer 293 are further surely short-circuited. As a result, the conductivity of the memory element is different before and after voltage application.

Consequently, properties of the memory element, such as a writing voltage are not varied and become stable; therefore, normal writing can be surely carried out in each element. Further, since a carrier injecting property is improved by a tunnel effect in the insulating layer, the thickness of the organic compound layer can be increased. Accordingly, a defect that the memory element is short-circuited in an initial state before electrical conduction can be prevented.

In the memory device shown in FIG. 7, the gate electrode layer 281, the source or drain electrode layer 285, the first conductive layer 286a, the first conductive layer 286b, and the partition (insulating layer) 287 are formed using a droplet discharge method. The droplet discharge method is a method in which a composition including a component forming material that is fluid is discharged (ejected) as a droplet to form into a desired pattern. A droplet containing a component forming material is discharged to a region to be formed of a component and is solidified by baking, drying, and the like to form a component in a desired pattern.

Figure 15:
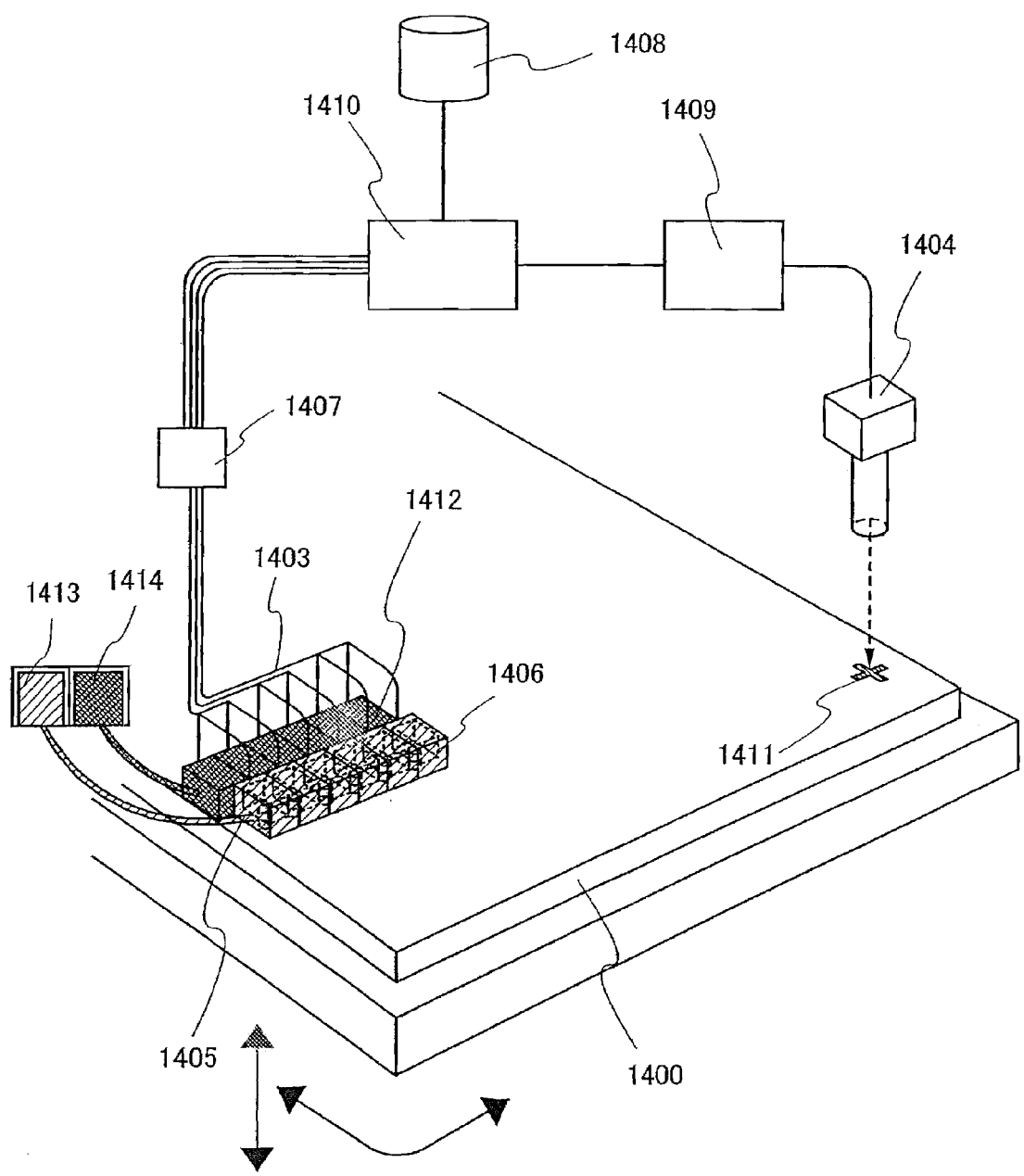
FIG. 15 is a view showing a structure of a droplet discharging device which can be applied to the invention.

FIG. 15 shows one mode of a droplet discharging device used for a droplet discharge method. Each of heads 1405 and 1412 of a droplet discharge means 1403 is connected to a control means 1407, and this control means 1407 is controlled by a computer 1410 so that a preprogrammed pattern can be drawn. The drawing timing may be determined, for example, based on a marker 1411 that is formed over a substrate 1400 as a reference. Alternatively, a reference point may be fixed based on an edge of the substrate 1400 as a reference. The reference point is detected by an imaging means 1404, and converted into a digital signal by an image processing means 1409. Then, the digital signal is recognized by the computer 1410 to generate a control signal, and the control signal is transmitted to the control means 1407. An image sensor or the like using a charge coupled device (CCD) or a complementary metal oxide semiconductor (CMOS) can be used as the imaging means 1404. Needless to say, data on a pattern to be formed over the substrate 1400 is stored in a storage medium 1408, and the control signal is transmitted to the control means 1407 based on the data, so that each of the heads 1405 and 1412 of the droplet discharge means 1403 can be individually controlled. The heads 1405 and 1412 are supplied with a material to be discharged from material supply sources 1413 and 1414 through pipes, respectively.

The head 1405 has an inside structure that has a space filled with a liquid material as shown by dotted lines 1406 and a nozzle that is a discharge opening. Although it is not shown, an inside structure of the head 1412 is similar to that of the head 1405. When the nozzle sizes of the heads 1405 and 1412 are different from each other, different materials with different widths can be drawn simultaneously. A conductive material, an organic material, an inorganic material, and the like can also be discharged from one head to draw a pattern. In the case of drawing in a wide area such as an interlayer film, the same material can be simultaneously discharged from a plurality of nozzles to improve throughput, and thus, drawing can be carried out. When a large-sized substrate is used, the heads 1405 and 1412 can freely scan over the substrate in directions indicated by arrows, and a region to be drawn can be freely set. Thus, a plurality of the same patterns can be drawn over one substrate.

In the case of forming a conductive layer by the droplet discharge method, a conductive layer is formed as follows: a composition containing a particle shaped conductive material is discharged, and fused or welded and joined by baking to be solidified. A conductive layer (or an insulating layer) formed by thus discharging and baking the composition containing the conductive material as aforementioned tends to show a polycrystalline state having many grain boundaries whereas a conductive layer (or an insulating layer) formed by a sputtering method tends to show a columnar structure.

Further, any structure may be used for a semiconductor layer included in the transistors. For example, an impurity region (including a source region, a drain region, and an LDD region) may be formed, and either a p-channel type or an n-channel type may be used. An insulating layer (sidewall) may be provided to have contact with side surfaces of the gate electrode, or a silicide layer may be formed in one or both of the source and drain regions, and the gate electrode. As a material for the silicide layer, nickel, tungsten, molybdenum, cobalt, platinum, or the like can be used.

As a material and a forming method of the first conductive layers 206a, 206b, 256a, 256b, 286a, and 286b, and the second conductive layers 213, 263, and 293 described in this embodiment mode, any one of the materials and the forming methods described in Embodiment Mode 1 can be employed.

Further, the organic compound layers 212, 262a, 262b, and 292 can be provided by using the same material and forming method as those of the organic compound layer 752 described in Embodiment Mode 1.

In addition, a rectifying element may be provided between the first conductive layers 206a, 206b, 256a, 256b, 286a, and 286b, and the insulating layers 216, 266a, 266b, and 296. The rectifying element typically refers to a transistor in which a gate electrode and a drain electrode are connected or a diode. For example, a PN junction diode provided by stacking an n-type semiconductor layer and a p-type semiconductor layer can be used. In this manner, since a current flows in only one direction by providing a rectifying diode, errors are reduced and reading margin is improved. Note that in the case of providing a diode, not only a diode having a PN junction but also a diode having another structure such as a diode having a PIN junction or an avalanche diode may be provided. Note that the rectifying element may be provided between the organic compound layers 212, 262a, 262b, and 292, and the second conductive layers 213, 263, and 293.

By the memory element of the invention, properties of the memory element, such as a writing voltage are not varied and become stable; therefore, normal writing can be surely carried out in each element. Further, since a carrier injecting property is improved by a tunnel current in the insulating layer, the thickness of the organic compound layer can be increased. Accordingly, a defect that the memory element is short-circuited in an initial state before electrical conduction can be prevented. As a result, a memory device and a semiconductor device with high reliability can be provided with high yield.

Embodiment Mode 3

In this embodiment mode, an example of a semiconductor device that has the memory device described in the aforementioned embodiment modes is described with reference to the drawings.

A semiconductor device described in this embodiment mode is capable of reading and writing data without contact. A data transmission method is broadly classified into an electromagnetic coupling method of communicating by mutual induction with a pair of coils disposed in the opposed position, an electromagnetic induction method of communicating by an inductive electromagnetic field, and a radio wave method of communicating by using radio waves, and any of these methods may be employed. An antenna that is used for transmitting data can be provided in two ways. One way is to provide an antenna over a substrate provided with a plurality of elements and memory elements, and the other way is to provide a terminal portion over a substrate provided with a plurality of elements and memory elements and connect an antenna provided over another substrate to the terminal portion.

First, one configuration example of a semiconductor device in the case of providing an antenna over a substrate provided with a plurality of elements and memory elements is described with reference to FIG. 10.

Figure 10:
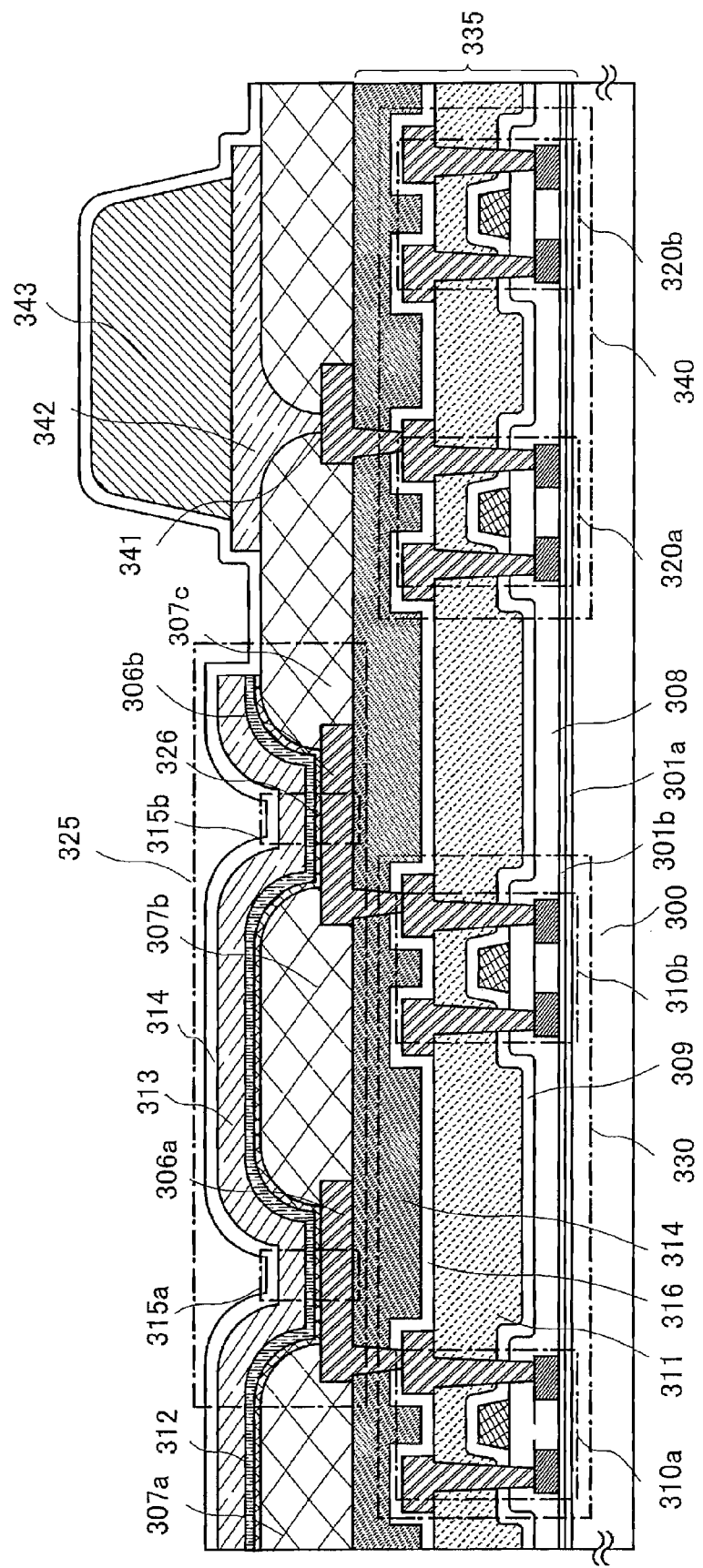
FIG. 10 is a diagram showing a semiconductor device of the invention.

FIG. 10 shows a semiconductor device including a memory device that has an active matrix structure. An element forming layer 335 that has a transistor portion 330 including transistors 310a and 310b, a transistor portion 340 including transistors 320a and 320b, and insulating layers 301a, 301b, 308, 311, 316, and 314 is provided over a substrate 300. A memory element portion 325 and a conductive layer 343 serving as an antenna are provided over the element forming layer 335.

Note that, shown here is the case where the memory element portion 325 or the conductive layer 343 serving as an antenna is provided above the element forming layer 335; however, the invention is not limited to this structure, and it is possible to provide the memory element portion 325 or the conductive layer 343 serving as an antenna below the element forming layer 335 or in the same layer as the element 335.

The memory element portion 325 includes memory elements 315a and 315b. The memory element 315a is formed by stacking a partition (insulating layer) 307a, a partition (insulating layer) 307b, an organic compound layer 312, and a second conductive layer 313 over a first conductive layer 306a. The memory element 315b is provided by stacking the partition (insulating layer) 307b, a partition (insulating layer) 307c, an insulating layer 326, the organic compound layer 312, and the second conductive layer 313 over a first conductive layer 306b. Further, the insulating layer 314 serving as a protective film is formed so as to cover the second conductive layer 313. The first conductive layers 306a and 306b in which the plurality of memory elements 315a and 315b are respectively formed, are connected to source electrode layers or drain electrode layers of the transistors 310a and 310b. In other words, each memory element is connected to one transistor. The insulating layer 326 and the organic compound layer 312 are formed entirely so as to cover the first conductive layers 306a and 306b, and the partitions (insulating layers) 307a, 307b, and 307c; however, the insulating layer 326 and the organic compound layer 312 may be formed selectively in each memory cell. Note that the memory elements 315a and 315b can be formed by using the materials and the forming methods described in the aforementioned embodiment modes.

In the invention, since it is only required to provide the insulating layer between the conductive layer and the organic compound layer, either the insulating layer or the partitions may be formed in first. Although the insulating layer is provided between the first conductive layer and the organic compound layer in this embodiment mode, the insulating layer may be provided only between the organic compound layer and the second conductive layer. Alternatively, the first conductive layer, the first insulating layer, the organic compound layer, the second insulating layer, and the second conductive layer may be stacked in this order so as to interpose the organic compound layer as described in Embodiment Mode 1.

In this embodiment mode, the insulating layer 326 has an insulation property. The insulating layer 326 may be a very thin film (the film thickness of the insulating layer is 4 nm or less, more preferably, 1 nm or more and 2 nm or less), and depending on a material and a manufacturing method of the insulating layer, the insulating layer may have not a shape as a continuous film but a discontinuous island-like shape. The insulating layer 326 which is formed at an interface between the first conductive layers 306a and 306b and the organic compound layer 312 allows the tunnel injection of carriers; therefore, a current stably flows to the organic compound layer 312. Accordingly, when a voltage is applied to the first conductive layers 306a and 306b and the second conductive layer 313, a current flows to the organic compound layer 312; thereby generating heat. When the temperature of the organic compound layer 312 rises to its glass-transition temperature, the material for forming the organic compound layer 312 turns into a fluid composition. Because of the surface tension of the composition (organic compound material) and bad wettability against a surface of the insulating layer 326 which is a formation substance, the fluid composition aggregates so as to flow (move) without maintaining the shape in a solid state, and change the shape. Consequently, the thickness of the organic compound layer 312 becomes uneven and the organic compound layer 312 is transformed, and the first conductive layers 306a and 306b are partially brought into contact with the second conductive layer 313, which short-circuits the first conductive layers 306a and 306b and the second conductive layer 313. As a result, the conductivity of the memory element is different before and after voltage application.

As described in this embodiment mode, the transformation of the organic compound layer 312 is promoted and the film thickness of the organic compound layer 312 can be made uneven by providing the insulating layer 326 having bad wettability against the organic compound layer 312 over the first conductive layers 306a and 306b over which the organic compound layer 312 using an organic compound with high surface tension is formed. Therefore, the first conductive layers 306a and 306b and the second conductive layer 313 are further surely short-circuited. As a result, the conductivity of the memory element is different before and after voltage application.

Consequently, properties of the memory element, such as a writing voltage are not varied and become stable; therefore, normal writing can be surely carried out in each element. Further, since a carrier injecting property is improved by a tunnel effect in the insulating layer, the thickness of the organic compound layer can be increased. Accordingly, a defect that the memory element is short-circuited in an initial state before electrical conduction can be prevented.

Further, in the memory element 315a, an element having a rectifying property may be provided between the first conductive layer 306a and the insulating layer 326, or between the organic compound layer 312 and the second conductive layer 313, as shown in the aforementioned embodiment modes. As the element having a rectifying property, the one described above can be used. Note that the same applies to the memory element 315b.

Here, the conductive layer 343 that serves as an antenna is provided over a conductive layer 342 which is formed in the same layer as the second conductive layer 313. Note that the conductive layer that serves as an antenna may be formed in the same layer as the second conductive layer 313.

As a material for the conductive layer 343 that serves as an antenna, a single element selected from gold (Au), platinum (Pt), nickel (Ni), tungsten (W), molybdenum (Mo), cobalt (Co), copper (Cu), aluminum (Al), manganese (Mn), titanium (Ti), and the like, an alloy containing a plurality of these elements, or the like can be used. Further, the conductive layer 343 that serves as an antenna can be formed by an evaporation method, a sputtering method, a CVD method, various printing methods such as screen printing and gravure printing, a droplet discharge method, or the like.

Each of the transistors 310a, 310b, 320a, and 320b that are included in the element forming layer 335, can be provided using a p-channel TFT, an n-channel TFT, or a CMOS combining a p-channel TFT and an n-channel TFT. Further, any type of structure may be used for a semiconductor layer that is included in the transistors 310a, 310b, 320a, and 320b. For example, an impurity region (including a source region, a drain region, and an LDD region) may be formed, or either a p-channel type or an n-channel type may be formed. Furthermore, an insulating layer (sidewall) may be formed so as to have contact with side surfaces of a gate electrode, and a silicide layer may be formed for one or both of a gate electrode and source and drain regions. As a material for the silicide layer, nickel, tungsten, molybdenum, cobalt, platinum, or the like can be used.

Further, the transistors 310a, 310b, 320a, and 320b that are included in the element forming layer 335 may be provided using organic transistors, in which semiconductor layers that constitute the transistors are formed with an organic compound. In this case, the element forming layer 335 including the organic transistor can be formed using a printing method, a droplet discharge method or the like, directly over the substrate 300 which is made of a flexible substrate such as plastic. The formation by using a printing method, a droplet discharge method, or like allows a semiconductor device to be manufactured at lower cost.

The element forming layer 335, the memory elements 315a and 315b, and the conductive layer 343 that serves as an antenna can be formed using an evaporation method, a sputtering method, a CVD method, a printing method, a droplet discharge method, or the like, as described above. Note that it is acceptable to use different methods in different portions. For example, a transistor for which high speed operation is needed can be provided by forming a semiconductor layer that is made of Si or the like over a substrate and then crystallizing it by a thermal treatment, and subsequently, a transistor that serves as a switching element can be provided as an organic transistor above an element forming layer by using a printing method or a droplet discharge method.

Note that a sensor connected to the transistor may be provided. As the sensor, an element that detects temperature, humidity, illuminance, gas, gravity, pressure, sound (vibration), acceleration, and other properties by physical or chemical means can be given. The sensor is typically formed by semiconductor elements such as a resistance element, a capacitance-coupled element, an inductively-coupled element, a photoelectromotive element, a photoelectric conversion element, a thermoelectromotive element, a transistor, a thermistor, or a diode.

Next, one configuration example of a semiconductor device in the case of providing a terminal portion in a substrate over which a plurality of elements and memory elements are provided, and connecting an antenna that is provided over another substrate to the terminal portion is described with reference to FIG. 11.

Figure 11:
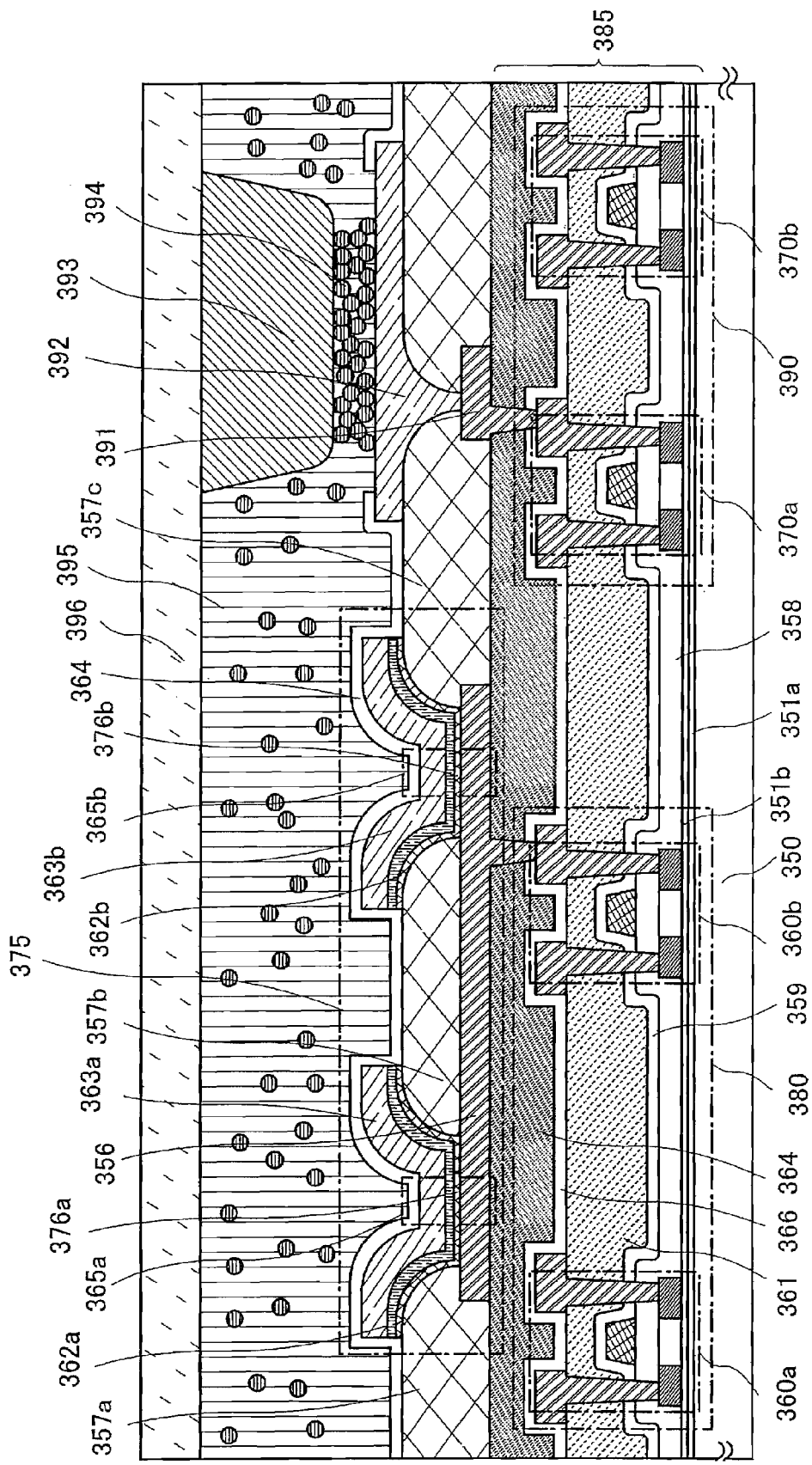
FIG. 11 is a diagram showing a semiconductor device of the invention.

FIG. 11 shows a semiconductor device that has a memory device of a passive matrix type, in which an element forming layer 385 is provided over a substrate 350, a memory element portion 375 is provided over the element forming layer 385, and a conductive layer 393 that serves as an antenna is provided over a substrate 396 so as to be electrically connected to the element forming layer 385. Note that although FIG. 11 shows a case where the memory element portion 375 or the conductive layer 393 that serves as an antenna is provided over the element forming layer 385, the invention is not limited to this structure, and the memory element portion 375 can be provided in the same layer as the element forming layer 385 or below it, or the conductive layer 393 that serves as an antenna can be provided below the element forming layer 385.

The memory element portion 375 is constituted by memory elements 365a and 365b. The memory element 365a is constituted by stacking partitions (insulating layers) 357a and 357b, an insulating layer 376a, an organic compound layer 362a, and a second conductive layer 363a over a first conductive layer 356; and the memory element 365b is constituted by stacking the partition (insulating layer) 357b, a partition (insulating layer) 357c, an insulating layer 376b, an organic compound layer 362b, and a second conductive layer 363b over the first conductive layer 356. Further, an insulating layer 364 that serves as a protective film is formed so as to cover the second conductive layers 363a and 363b. Furthermore, the first conductive layer 356 in which a plurality of memory elements 365a and 365b are formed, is connected to a source electrode layer or a drain electrode layer of the single transistor 360b. In other words, the plurality of memory elements are connected to the same transistor. Further, for the organic compound layers 362a and 362b, the partitions (insulating layers) 357a, 357b, and 357c are provided to separate the insulating layers for each memory cell; however, if there is no concern for an influence of an electric field in the lateral direction between adjacent memory cells, an insulating layer may be formed over the entire surface. Note that the memory elements 365a and 365b can be formed using the materials and the manufacturing methods described in the aforementioned embodiment modes.

In the invention, since it is only required to provide the insulating layer between the conductive layer and the organic compound layer, either the insulating layer or the partitions may be formed in first. Although the insulating layer is provided between the first conductive layer and the organic compound layer in this embodiment mode, the insulating layer may be provided only between the organic compound layer and the second conductive layer as described in Embodiment Mode 1. Alternatively, the first conductive layer, the first insulating layer, the organic compound layer, the second insulating layer, and the second conductive layer may be stacked in this order with the organic compound layer interposed therebetween.

In this embodiment mode, the insulating layers 376a and 376b have an insulation property. Each of the insulating layers 376a and 376b may be a very thin film (the film thickness of the insulating layer is 4 nm or less, more preferably, 1 nm or more and 2 nm or less), and depending on a material and a manufacturing method of the insulating layers, the insulating layers may have not a shape as a continuous film but a discontinuous island-like shape. The insulating layers 376a and 376b which are formed at an interface between the first conductive layers 356 and the organic compound layer 362a/362b allow the tunnel injection of carriers; therefore, a current stably flows to the organic compound layers 362a and 362b. Accordingly, when a voltage is applied to the first conductive layer 356 and the second conductive layers 263a and 263b, a current flows to the organic compound layers 362a and 362b; thereby generating heat. When the temperature of the organic compound layers 362a and 362b rises to its glass-transition temperature, the material for forming the organic compound layers 362a and 362b turns into a fluid composition. Because of the surface tension of the composition (organic compound material) and bad wettability against a surface of the insulating layers 376a and 376b which are formation substances, the fluid composition aggregates so as to flow (move) without maintaining the shape in a solid state, and change the shape. Consequently, the thickness of the organic compound layers 362a and 362b becomes uneven and each of the organic compound layers 362a and 362b is transformed, and a first conductive layer 356 is partially brought into contact with the second conductive layers 363a and 363b, which short-circuits the first conductive layer 355 and the second conductive layers 363a and 363b. As a result, the conductivity of the memory element is different before and after voltage application.

As described in this embodiment mode, the transformation of the organic compound layers 362a and 362b is promoted and the film thickness of the organic compound layers 362a and 362b can be made uneven by providing the insulating layers 376a and 376b having bad wettability against the organic compound layers 362a and 362b over the first conductive layer 356 over which the organic compound layers 362a and 362b using an organic compound with high surface tension are formed. Therefore, the first conductive layer 356 and the second conductive layers 363a and 363b can be further surely short-circuited. As a result, the conductivity of the memory element is different before and after voltage application.

Consequently, properties of the memory element, such as a writing voltage are not varied and become stable; therefore, normal writing can be surely carried out in each element. Further, since a carrier injecting property is improved by a tunnel effect in the insulating layer, the organic compound layer can be thickened. Accordingly, a defect that the memory element is short-circuited in an initial state before electrical conduction can be prevented.

A substrate including the element forming layer 385 and the memory element portion 375, and the substrate 396 provided with the conductive layer 393 that serves as an antenna, are attached to each other with a resin 395 that has an adhesive property. The element forming layer 385 and the conductive layer 393 are electrically connected by conductive fine particles 394 that are included within the resin 395. Further, a conductive adhesive agent such as a silver paste, a copper paste, or a carbon paste, or a method of carrying out a solder joint may be used to attach the substrate including the element forming layer 385 and the memory element portion 375 to the substrate 396 provided with the conductive layer 393 that serves as an antenna.

In this manner, a semiconductor device provided with a memory device and an antenna can be formed. In this embodiment mode, the element forming layer can be provided also by forming a thin film transistor over the substrate, or the element forming layer may also be provided by using a semiconductor substrate of Si or the like as a substrate, and forming a field effect transistor over the substrate. Further, an SOI substrate may be used as a substrate, and the element forming layer may be provided thereover. In this case, the SOI substrate may be formed by using a method of attach wafers to each other, or a method called SIMOX in which an insulating layer is internally formed by implanting oxygen ions into a Si substrate.

Furthermore, the memory element portion may be provided on the substrate provided with the conductive layer which serves as an antenna. Further, a sensor connected to the transistor may be provided.

Note that this embodiment mode can be carried out by freely combining with the aforementioned embodiment modes. Further, the semiconductor device that is manufactured in this embodiment mode can be provided over a flexible substrate by separating it from the substrate through a known separating step and sticking it to the flexible substrate, thereby a flexible semiconductor device can be obtained. The flexible substrate corresponds to a film made of polypropylene, polyester, vinyl, polyvinyl fluoride, vinyl chloride, or the like; paper made of a fibrous material; a stacked film of a base film (such as polyester, polyamide, an inorganic evaporation film, or paper), and an adhesive synthetic resin film (acrylic-based synthetic resin, epoxy-based synthetic resin, or the like), and the like. The film is obtained by heating treatment and a pressure treatment with a treatment object. When the heating treatment and the pressure treatment are carried out, an adhesive layer that is provided over the outermost surface of the film, or a layer (not the adhesive layer) that is provided as the outermost layer is melted by a heating treatment, then it is attached by applying pressure. Further, the adhesive layer either may or may not be provided on a base. The adhesive layer corresponds to a layer that contains an adhesive agent such as a thermosetting resin, an ultraviolet curable resin, an epoxy resin, or a resin additive.

By the memory element of the invention, properties of the memory element, such as a writing voltage are not varied and become stable; therefore, normal writing can be carried out in each element. Further, since a carrier injecting property is improved by a tunnel current in the insulating layer, the film thickness of the organic compound layer can be increased. Accordingly, a defect that the memory element is short-circuited in an initial state before electrical conduction can be prevented. As a result, a memory device and a semiconductor device with high reliability can be provided with high yield.

Embodiment Mode 4

In this embodiment mode, description is made on data reading or writing in a semiconductor device having the aforementioned structures.

Data writing to the semiconductor device having the aforementioned structure can be carried out by applying an electrical effect. Description is made on a case where data writing is carried out by applying an electrical effect (FIG. 3).

When data writing is carried out by applying an electrical effect, one memory cell 721 is selected by a row decoder 724a, a column decoder 726a, and a selector 726c, and data is written thereafter to the memory cell 721 by using a writing circuit. Specifically, a high voltage is selectively applied to the organic compound layer 752 of a desired portion so that a high current flows therethrough, and the first conductive layer 751b and the second conductive layer 753b are short-circuited.

The electrical resistance of the short-circuited portion is significantly lower compared to that of other portions. In this manner, by utilizing the change in the electrical resistance between two conductive layers caused by applying an electrical effect, data writing is carried out. For example, in the case where an organic compound layer to which an electrical effect is not applied is data "0", when data "1" is written, the electrical resistance is made lower by selectively applying a high voltage to the organic compound layer of a desired portion so that a large current flows therethrough and a short circuit is caused.

Figure 16:
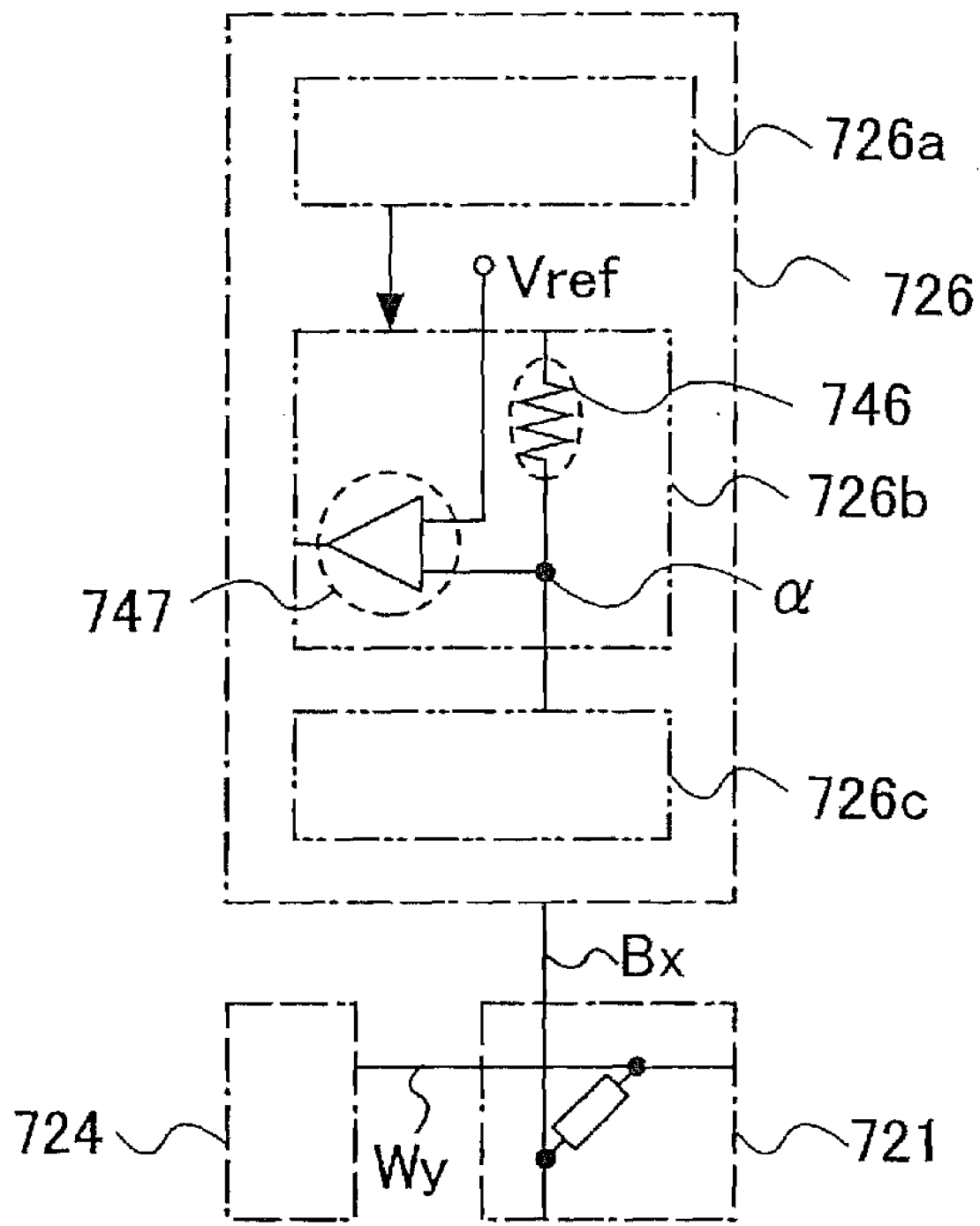
FIG. 16 is a diagram showing a memory device of the invention.

Next, description is made on an operation when carrying out data reading from a memory element (see FIG. 16). Here, a reading circuit 726b has a structure including a resistance element 746 and a sense amplifier 747. However, a structure of the reading circuit 726b is not limited to the aforementioned structure, and any kind of structure may be used.

Data reading is carried out by applying a voltage between the first conductive layer 751b and the second conductive layer 753b, and reading the electrical resistance of the organic compound layer 752. For example, as described above, when data writing is carried out by applying an electrical effect, a resistance value Ra1 when an electrical effect is not applied, and a resistance value Rb1 when an electrical effect is applied to cause a short circuit between the two conductive films, satisfy Ra1>Rb1. Data reading is carried out by electrically reading such a difference in the resistance values.

For example, when data is read from the memory cell 721 disposed in the x-th column and the y-th row, among the plurality of memory cells 721 included in the memory cell array 722, first, a bit line Bx in the x-th column and a word line Wy in the y-th row are selected by the row decoder 724a, the column decoder 726a, and the selector 726c. Then, an organic compound layer included in the memory cell 721 and the resistance element 746 are connected in series to each other. In this manner, when a voltage is applied to both ends of two resistance elements connected in series, the potential of a node $\alpha$ becomes a resistance-divided potential in accordance with the resistance value Ra or Rb of the organic compound layer 752. Then, the potential of the node $\alpha$ is supplied to the sense amplifier 747, and in the sense amplifier 747, which of the data "0" or "1" is contained is judged. Subsequently, a signal containing data "0" or "1" that is judged in the sense amplifier 747 is supplied to the outside.

According to the aforementioned method, a condition of the electrical resistance of the organic compound layer is read with a voltage value by utilizing a difference in resistance values and resistance division. However, a method of comparing current values is also acceptable. This, for example, utilizes the fact that Ia1<Ib1 is satisfied, provided that Ia1 is a current value in the case where an electrical effect is not applied to an organic compound layer, and Ib1 is a resistance value in the case where an electrical effect is applied to cause a short circuit between the two conductive films. In this manner, data reading may be carried out by electrically reading a difference in current values.

A memory element having the aforementioned structure and a semiconductor device provided with the memory element are nonvolatile memories; therefore, a battery for holding data is not necessary. A compact size, thin, and lightweight semiconductor device can be provided. Further, although data writing (additional writing of data) is possible by using the insulating material used in the aforementioned embodiment modes as an organic compound layer, rewriting of data cannot be carried out. Consequently, falsification can be prevented and a semiconductor device with high security can be provided.

Note that in this embodiment mode, description has been made using as an example a passive matrix memory element which has a simple memory circuit configuration and a semiconductor device provided with the memory element; however, data writing or reading can be carried out in the same manner even in the case of having an active matrix memory circuit.

Here, data reading of a memory element portion by an electrical effect in the case of an active matrix type is described with reference to specific examples in FIGS. 14A and 14B.

Figure 14A:
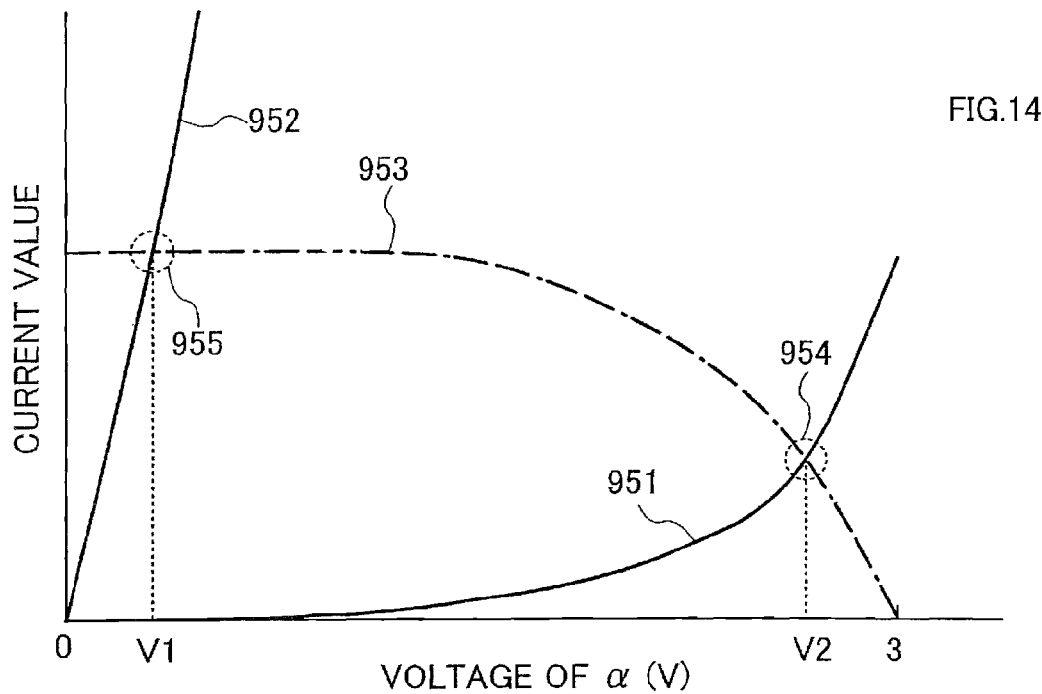
FIG. 14A is a graph showing a memory device of the invention and FIG. 14B is a circuit diagram showing a memory device of the invention.
Figure 14B:
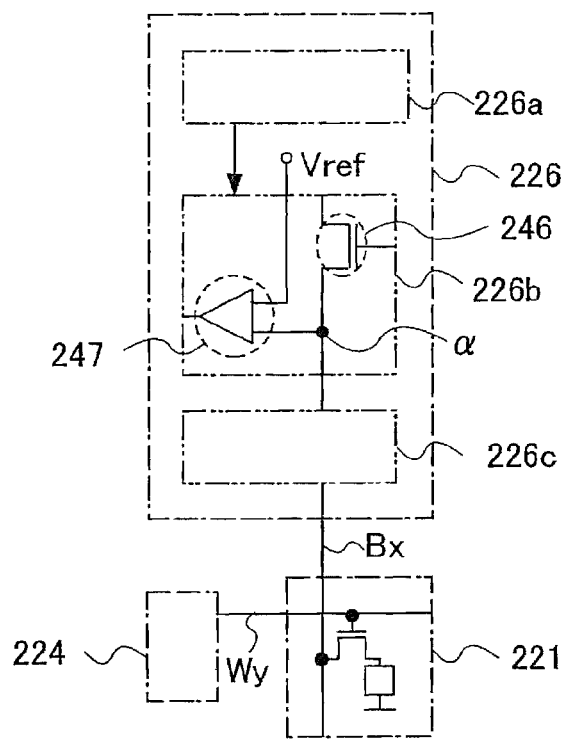

FIG. 14A shows a current-voltage property 951 of a memory element portion when data "0" is written to a memory element portion; a current-voltage property 952 of the memory element portion when data "1" is written thereto; and a current-voltage property 953 of a resistance element 246. Here, the case where a transistor is used for the resistance element 246 is shown. Further, as an operating voltage for data reading, a case of applying 3 V between a first conductive layer 243 and a second conductive layer 245 is described.

For a memory cell in FIG. 14A having a memory element portion to which data "0" is written, an intersection 954 of the current-voltage property 951 of the memory element portion and the current-voltage property 953 of the transistor becomes an operation point, and the potential of the node $\alpha$ at this time is V1 (V). The potential of the node $\alpha$ is supplied to a sense amplifier 247, and in the sense amplifier 247, the data stored in the aforementioned memory cell is judged as "0".

On the other hand, for a memory cell having a memory element portion to which data "1" is written, an intersection 955 of the current-voltage property 952 of the memory element portion and the current-voltage property 953 of the transistor becomes an operation point, and the potential of the node $\alpha$ at this time is V2 (V) (V1>V2). The potential of the node α is supplied to the sense amplifier 247, and in the sense amplifier 247, the data stored in the aforementioned memory cell is judged as "1".

In this manner, by reading the resistance-divided potential in accordance with the resistance value of the memory element portion 241, data stored in the memory cell can be judged.

Note that this embodiment mode can be carried out by freely combining with the structures of a memory element and a semiconductor device provided with the memory element, which are described in the aforementioned embodiment modes.

Embodiment Mode 5

Figure 12A:
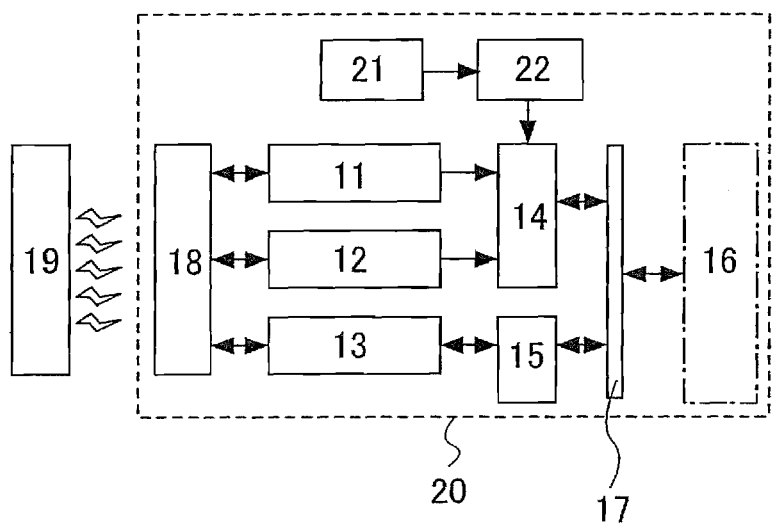
FIGS. 12A and 12B are views showing a manufacturing method of a semiconductor device of the invention.
Figure 12B:
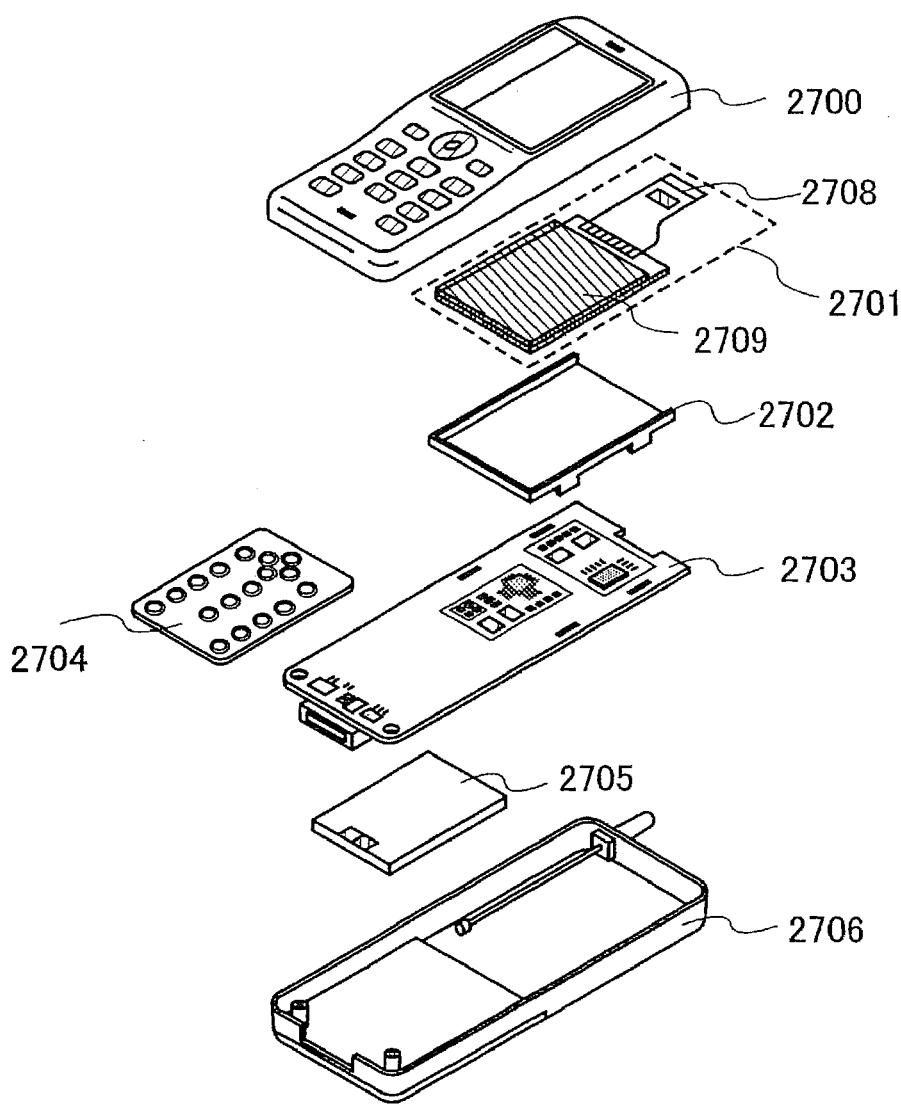

The structure of the semiconductor device of this embodiment mode is described with reference to FIGS. 12A and 12B. As shown in FIG. 12A, a semiconductor device 20 of the invention has a function of data exchange without contact, and has a power source circuit 11; a clock generation circuit 12; a data demodulation/modulation circuit 13; a control circuit 14 which controls other circuits; an interface circuit 15; a memory circuit 16; a data bus 17; an antenna (antenna coil) 18; a sensor 21; and a sensor circuit 22.

The power source circuit 11 is a circuit for generating various power sources that are supplied to each circuit within the semiconductor device 20, based on an alternating current signal that is inputted from the antenna 18. The clock generation circuit 12 is a circuit that generates various clock signals that are supplied to each circuit within the semiconductor device 20, based on an alternating current signal inputted from the antenna 18. The data demodulation/modulation circuit 13 has a function of demodulating/modulating data that is communicated with a reader/writer 19. The control circuit 14 has a function of controlling the memory circuit 16. The antenna 18 has a function of carrying out transmission/reception of electromagnetic waves or electric waves. The reader/writer 19 communicates with the semiconductor device, controls the semiconductor device, and processes data thereof. Note that the semiconductor device is not limited to the aforementioned structure, and for example, the structure may be added with another component such as a limiter circuit of a power source voltage or hardware dedicated to encryption.

The memory circuit 16 is characterized by having a memory element in which an organic compound layer or a phase change layer is interposed between a pair of conductive layers. Note that the memory circuit 16 may have only a memory element in which an organic compound layer or a phase change layer is interposed between a pair of conductive layers, or may have a memory circuit of another structure. The memory circuit of another structure corresponds to, for example, one or more of a DRAM, an SRAM, an FeRAM, a mask ROM, a PROM, an EPROM, an EEPROM and a flash memory.

The sensor 21 includes a semiconductor element such as a resistance element, a capacitance-coupled element, an inductively-coupled element, a photoelectromotive element, a photoelectric conversion element, a thermoelectromotive element, a transistor, a thermistor, or a diode. The sensor circuit 22 detects a change in impedance, reactance, inductance, a voltage, or a current, then carries out an analog/digital conversion (A/D conversion), and outputs a signal to the control circuit 14.

Embodiment Mode 6

By the invention, a semiconductor device that serves as a processor chip (also referred to as a wireless chip, a wireless processor, a wireless memory, and a wireless tag) can be formed. The semiconductor device of the invention has a wide range of use, and for example, it can be used by being mounted on bills, coins, securities, certificates, bearer bonds, packaging cases, books, recording media, personal belongings, vehicles, foods, clothes, health items, commodities, medicals, electronic devices or the like.

Figure 13A:
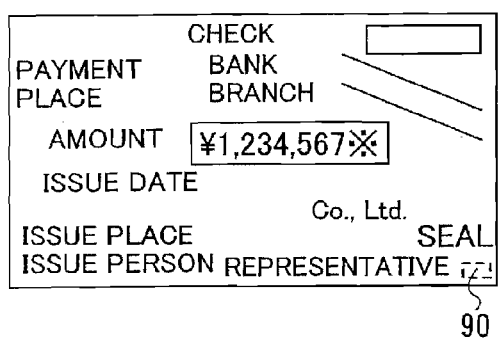
FIGS. 13A to 13G are views of semiconductor devices of the invention.
Figure 13B:
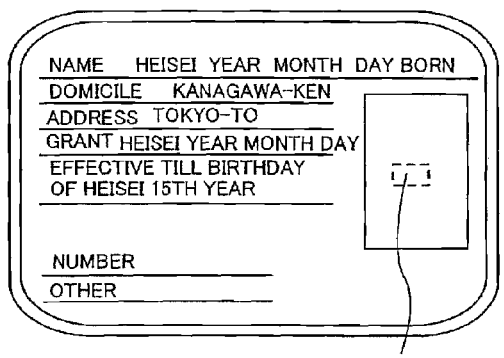
Figure 13C:
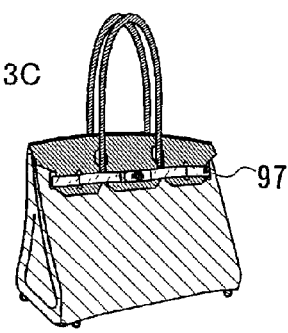
Figure 13D:
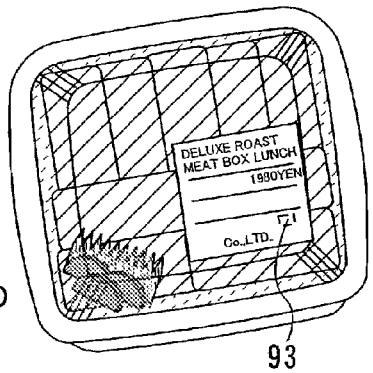
Figure 13E:
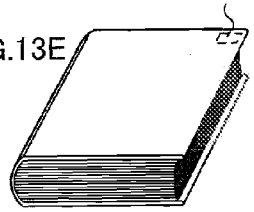
Figure 13F:
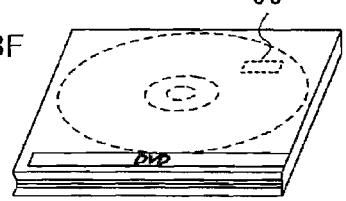
Figure 13G:
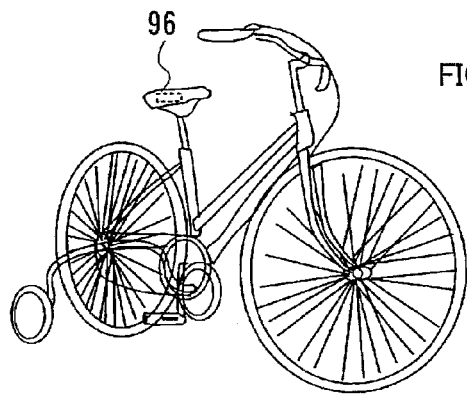

The bills and the coins mean currency in the market and include something that is used in the same way as a currency in a specific area (a cash voucher), memorial coins, and the like. The securities mean a check, a stock certificate, a promissory bill, and the like and can be provided with a processor chip 90 (see FIG. 13A). The certificates mean a driver's license, a resident card, and the like and can be provided with a processor chip 91 (see FIG. 13B). The vehicles mean a wheeled vehicle such as a bicycle, a vessel, and the like and can be provided with a processor chip 96 (see FIG. 13G). The bearer bonds mean a stamp, a rice coupon, various gift coupons, and the like. The packing cases mean wrapping paper for a box lunch or the like, a plastic bottle, and the like and can be provided with a processor chip 93 (see FIG. 13D). The books mean a document, a volume, and the like and can be provided with a processor chip 94 (see FIG. 13E). The recording media mean DVD software, a video tape, and the like and can be provided with a processor chip 95 (see FIG. 13F). The personal belongings mean a bag, glasses, and the like and can be provided with a processor chip 96 (see FIG. 13G). The foods mean foodstuff, beverages, and the like. The clothes mean wear, footwear, and the like. The health items mean medical devices, health appliances, and the like. The commodities mean furniture, a lighting appliance, and the like. The medicals mean medicines, agricultural chemicals, and the like. The electronic devices mean a liquid crystal display device, an EL display device, a television device (a TV set and a thin TV set), a mobile phone, and the like.

The semiconductor device of the invention is fixed to an item by being mounted on a printed substrate, by attaching to a surface, implanting, or the like. For example, it is fixed to a book by being implanted in paper, or it is fixed to a packaging case made of an organic resin, by being implanted in the organic resin. Since the semiconductor device of the invention realizes miniaturization, thinness, and lightweight, it does not detract from the design of an item itself after it is fixed to the item. Further, by providing the semiconductor device of the invention on bills, coins, securities, bearer bonds, certificates and the like, an authentication function can be provided, and by utilizing this authentication function, falsification can be prevented. Furthermore, by providing the semiconductor device of the invention on packaging cases, recording media, personal belongings, foods, clothes, commodities, electronic devices and the like, improvement in efficiency for inspection systems and the like can be achieved.

Next, description is made with reference to drawings on one mode of an electronic device on which the semiconductor device of the invention is mounted. An example shown here is a mobile phone which has casings 2700 and 2706; a panel 2701; a housing 2702; a printed wiring board 2703; an operation button 2704; and a battery 2705 (see FIG. 12B). The panel 2701 is detachably incorporated in the housing 2702, and the housing 2702 is fitted to the printed wiring board 2703. The shape and size of the housing 2702 is appropriately changed depending on an electronic device in which the panel 2701 is to be incorporated. On the printed wiring board 2703, a plurality of packaged semiconductor devices are mounted, and as one of these, the semiconductor device of the invention can be used. The plurality of semiconductor devices that are mounted on the printed wiring board 2703 have any of the functions of a controller, a central processing unit (CPU), a memory, a power source circuit, an audio processing circuit, a transmission/reception circuit and the like.

The panel 2701 is combined with the printed wiring board 2703 via a connection film 2708. The panel 2701, the housing 2702, and the printed wiring board 2703 are housed in the casings 2700 and 2706, along with the operation button 2704 and the battery 2705. A pixel region 2709 included in the panel 2701 is disposed so that it is visible from an opening window that is provided in the casing 2700.

The semiconductor device of the invention is compact in size, thin, and lightweight, and because of these properties, the limited space inside of the casings 2700 and 2706 of an electronic device can be used effectively.

Since the semiconductor device of the invention has a memory element with a simple structure in which an organic compound layer is interposed between a pair of conductive layers, an electronic device using an inexpensive semiconductor device can be provided. Further, higher integration is easy for the semiconductor device of the invention; therefore, an electronic device that uses a semiconductor device having a high-capacity memory circuit can be provided.

The memory device included in the semiconductor device of the invention is characterized by carrying out data writing by an electrical effect, being nonvolatile, and capable of additional writing of data. By the aforementioned properties, falsification by rewriting can be prevented, and new data can be additionally written. Consequently, an electronic device using the semiconductor device realizing higher function and higher added value can be provided.

Note that the casings 2700 and 2706 show an example of an exterior shape of a mobile phone, and the electronic device according to this embodiment mode may transform into various modes in accordance with the function or use.

Embodiment Mode 7

In this embodiment mode, description is made on data reading or writing in a memory device having the aforementioned structures.

One example of a structure of the semiconductor device of the invention is shown in FIG. 17A, which has a memory cell array 1722 in which memory cells 1721 are provided in matrix; a circuit 1726 having a reading circuit and a writing circuit; a decoder 1724, and a decoder 1723. Note that the structure of a memory device 1716 shown here is only one example, and it may have another circuit such as a sense amplifier, an output circuit, a buffer, or an interface which carries out interactions with the outside.

The memory cell 1721 has a first conductive layer connected to a bit line Bx ($1 \leq x \leq m$), a second conductive layer connected to a word line Wy ($1 \leq y \leq n$), and an insulating layer. The insulating layer is provided between the first and second conductive layers as a single layer or as stacked layers.

An operation when carrying out data writing in a memory element of a passive matrix memory device is described with reference to FIGS. 17A to 17C and FIGS. 18A to 18C. Data writing is carried out by an electrical effect. Note that writing is carried out by changing an electrical property of a memory cell, and data of an initial condition (condition when an electrical effect is not applied) of a memory cell is data "0", and a condition in which the electrical property is changed is "1".

When writing data "1" to the memory cell 1721, the memory cell 1721 is selected by the decoders 1723 and 1724, and a selector 1725. Specifically, a predetermined voltage V2 is applied to a word line W3 connected to the memory cell 1721, by the decoder 1724. Further, by the decoder 1723 and the selector 1725, a bit line B3 which is connected to the memory cell 1721 is connected to the circuit 1726. Then, a writing voltage V1 is outputted from the circuit 1726 to the bit line B3. In this manner, a potential (voltage) Vw=V1−V2 is applied between the first and second conductive layers which constitute the memory cell 1721. By appropriately selecting the potential Vw, an insulating layer provided between the conductive layers is changed physically or electrically, and writing of data "1" is carried out. Specifically, at a reading operation voltage, it is preferable to change the electric resistance between the first and second conductive layers when data is "1" so as to be significantly lower compared to that when data is "0". For example, the potential may be appropriately selected from the range of (V1, V2)=(0 V, 5 to 15 V), or (3 to 5 V, −12 to −2 V). The potential Vw may be 5 to 15 V, or −5 to −15 V.

Note that an unselected word line and an unselected bit line are controlled so that data "1" is not written to a memory cell that is connected thereto. For example, the unselected word line and the unselected bit line may be brought into a floating state. The first and second conductive layers constituting the memory cell are required to have diode properties and the like by which lines can be accurately selected.

On the other hand, data "0" is written to the memory cell 1721 by not applying an electrical effect on the memory cell 1721. In terms of circuit operation, the memory cell 1721 is selected by the decoders 1723 and 1724, and the selector 1725 in the same manner as the case where "1" is written; however, an output potential from the circuit 1726 to the bit line B3 is to be approximately equal to a potential of a selected word line W3 or a potential of an unselected word line, and a voltage that does not change the electrical property of the memory cell 1721 (for example, −5 to 5 V) may be applied between the first and second conductive layers that constitute the memory cell 1721.

Subsequently, description is made on an operation of carrying out data reading from a memory element in a passive matrix memory device (see FIGS. 17A to 17C). Data reading is carried out by utilizing a difference in the electronic properties of first and second conductive layers which constitute a memory cell, between in a memory cell having data "0" and in a memory cell having data "1." As an example, a reading method by utilizing a difference in an electrical resistance is described, provided that an effective electrical resistance (hereinafter, simply referred to as an electrical resistance of a memory cell) between the first and second conductive layers that constitute a memory cell having data "0" is R0 at a reading voltage, and an electrical resistance of a memory cell having data "1" is R1 at a reading voltage. Note that R1<<R0 is satisfied. For a structure of a reading portion of a reading/writing circuit, for example, the circuit 1726 using a resistance element 1746 and a differential amplifier 1747 as shown in FIG. 17B can be considered. The resistance element 1746 has a resistance value Rr and R1<Rr<R0 is satisfied. It is also possible to use a transistor 1748 in the place of the resistance element 1746, and a clocked inverter 1749 in the place of the differential amplifier (FIG. 17C). The clocked inverter 1749 is inputted with a signal φ or an inverted signal φ, which becomes Hi when reading is carried out and becomes Lo when it is not carried out. Needless to say, the circuit configuration is not limited to those of FIGS. 17A to 17C.

When data reading from the memory cell 1721 is carried out, the memory cell 1721 is selected first by the decoders 1723 and 1724, and the selector 1725. Specifically, by the decoder 1724, a predetermined voltage Vy is applied to a word line Wy connected to the memory cell 1721. Further, by the decoder 1723 and the selector 1725, a bit line Bx which is connected to the memory cell 1721 is connected to a terminal P of the circuit 1726. As a result, a potential Vp of the terminal P is a value determined by resistance division by the resistance element 1746 (resistance value Rr) and the memory cell 1721 (resistance value R0 or R1). Consequently, when the memory cell 1721 has data "0", $Vp0=Vy+(V0-Vy)\times R0/(R0+Rr)$ is satisfied. Further, when the memory cell 1721 has data "1," $Vp1=Vy+(V0-Vy)\times R1/(R1+Rr)$ is satisfied. As a result, by selecting Vref so as to be between Vp0 and Vp1 in FIG. 17B; and by selecting a point of variation of the clocked inverter so as to be between Vp0 and Vp1 in FIG. 17C, reading can be carried out by outputting Lo/Hi (or Hi/Lo) as an output potential Vout, in accordance with data "0"/"1".

For example, the differential amplifier is operated with Vdd=3 V, wherein Vy=0 V, V0=3 V, and Vref=1.5 V are satisfied. Suppose that R0/Rr=Rr/R1=9 is satisfied, in the case where data of a memory cell is "0", Vp0=2.7 V is satisfied and Hi is outputted as Vout; and in the case where data of a memory cell is "1", Vp1=0.3 V is satisfied and Lo is outputted as Vout. In this manner, reading of a memory cell can be carried out.

According to the aforementioned method, the condition of the electrical resistance of the insulating layer is read with a voltage value by utilizing a difference in resistance values and resistance division. Needless to say, the reading method is not limited to this method. For example, other than using a difference in electrical resistance, reading may be carried out by using a difference in current values. Further, when the electrical property of a memory cell has a diode property where a threshold voltage differs between data "0" and data "1", the difference in the threshold voltages may be used for reading.

Description is made on an operation when carrying out data writing to a memory element of an active matrix memory device (see FIGS. 18A to 18C).

FIGS. 18A to 18C show one configuration example of a memory device that is described in this embodiment mode, which includes a memory cell array 1232 in which memory cells 1231 are provided in matrix, a circuit 1226, and decoders 1224 and 1223. The circuit 1226 has a reading circuit and a writing circuit. Note that the structure of a memory device 1217 that is shown here is only one example, and another circuit such as a sense amplifier, an output circuit, a buffer, an interface for carrying out interactions with the outside, or the like may be included.

The memory cell 1231 has a first wire connected to a bit line Bx ($1 \leq x \leq m$), a second wire connected to a word line Wy ($1 \leq y \leq n$), a transistor 1210a, a memory element 1215b, and a memory cell 1231. The memory element 1215b has a structure in which an insulating layer is interposed between a pair of conductive layers. A gate electrode of the transistor is connected to the word line, one of a source electrode and a drain electrode is connected to the bit line, and the other is connected to one of two terminals of the memory element. The other terminal of the memory element is connected to a common electrode (potential Vcom).

First, an operation when carrying out data writing by an electrical effect is described. Note that writing is carried out by changing an electrical property of a memory cell, and data of an initial condition (condition in which an electrical effect is not applied) of the memory cell is data "0", and a condition in which the electrical property is changed is "1".

Here, description is made on data writing to the memory cell 1231 disposed in the n-th row and the m-th column. When data "1" is written to the memory cell 1231, the memory cell 1231 is first selected by the decoders 1223 and 1224, and a selector 1225. Specifically, a predetermined voltage V22 is applied to a word line Wn connected to the memory cell 1231, by the decoder 1224. Further, by the decoder 1223 and the selector 1225, a bit line Bm that is connected to the memory cell 1231 is connected to the circuit 1226 that has the reading circuit and the writing circuit. Then, a writing voltage V21 is outputted from the circuit 1226 to the bit line B3.

In this manner, the transistor 1210a that constitutes the memory cell is turned on, the bit line is electrically connected to the memory element 1215b, and a potential (voltage) of approximately Vw=Vcom−V21 is applied. Note that one electrode of the memory element 1215b is connected to a common electrode having the potential Vcom. By appropriately selecting a potential Vw, the insulating layer provided between the conductive layers is changed physically or electrically, and writing of data "1" is carried out. Specifically, at a reading operation voltage, the electrical resistance between the first and second conductive layers when data is "1" is to be changed so as to be significantly lower compared to that when data is "0", or they may simply be short-circuited. Note that the potential may be appropriately selected from the range of (V21, V22, Vcom)=(5 to 15 V, 5 to 15 V, 0 V) or (−12 to 0 V, −12 to 0 V, 3 to 5 V). The potential Vw may be 5 to 15 V or −5 to −15 V.

An unselected word line and an unselected bit line are controlled so that data "1" is not written to a memory cell that is connected thereto. Specifically, a potential (for example, 0 V) which turns off the transistor of the connected memory cell may be applied to the unselected word line; and the unselected bit line may be brought into a floating state, or a potential of approximately equal to Vcom may be applied.

On the other hand, data "0" is written to the memory cell 1231 by not applying an electrical effect to the memory cell 1231. In terms of circuit operation, for example, in the same manner as when writing "1," the memory cell 1231 is selected by the decoders 1223 and 1224, and the selector 1225; however, the output potential from the circuit 1226 to the bit line B3 is approximately equal to Vcom, or the bit line B3 is brought into a floating state. As a result, a low potential (for example, −5 to 5 V) is applied or no voltage (potential) is applied to the memory element 1215b; therefore, the electrical property does not change, and writing of data "0" is realized.

An operation when data reading is carried out by an electrical effect is described. Here, the circuit 1226 has a structure including a resistance element 1246 and a differential amplifier 1247. It is to be noted that the configuration of the circuit 1226 is not limited to the aforementioned configuration, and may have any kind of configuration.

Subsequently, description is made on an operation when data reading is carried out by an electrical effect in an active matrix memory device. Data reading is carried out by utilizing the difference in electrical properties of the memory element 1215b between in a memory cell having data "0" and in a memory cell having data "1." As an example, a method of reading by utilizing a difference in an electrical resistance is described, provided that an electrical resistance of the memory element that constitutes a memory cell having data "0" is R0 at a reading voltage, and the electrical resistance of the memory element that constitutes a memory cell having data "1" is R1 at a reading voltage. Note that R1<<R0 is satisfied. For a configuration of a reading portion of a reading/writing circuit, for example, the circuit 1226 using the resistance element 1246 and the differential amplifier 1247 as shown in FIG. 18B can be considered. The resistance element has a resistance value Rr and R1<Rr<R0 is satisfied. It is also possible to use a transistor 1249 in the place of the resistance element 1246, and a clocked inverter 1248 in the place of the differential amplifier (FIG. 18C). Needless to say, the circuit configuration is not limited to those of FIGS. 18A to 18C.

When data reading is carried out from the memory cell 1231 in the x-th row and the y-th column, the memory cell 1231 is first selected by the decoders 1223 and 1224, and the selector 1225. Specifically, by the decoder 1224, a predetermined voltage V24 is applied to a word line Wy that is connected to the memory cell 1231, and the transistor 1210a is turned on. Further, by the decoder 1223 and the selector 1225, a bit line Bx that is connected to the memory cell 1231 is connected to a terminal P of the circuit 1226. As a result, a potential Vp of the terminal P is determined by resistance division of Vcom and V0 by the resistance element 1246 (resistance value Rr) and the memory element 1215b (resistance value R0 or R1). Consequently, when the memory cell 1231 has data "0", Vp0=Vcom+(V0−Vcom)×R0/(R0+Rr) is satisfied. Further, when the memory cell 1231 has data "1", Vp1=Vcom+(V0−Vcom)×R1/(R1+Rr) is satisfied. As a result, by selecting Vref to be between Vp0 and Vp1 in FIG. 18B, and by selecting a point of variation of the clocked inverter to be between Vp0 and Vp1 in FIG. 18C, reading can be carried out by outputting Lo/Hi (or Hi/Lo) as an output potential Vout in accordance with data "0"/"1".

For example, the differential amplifier is operated at Vdd=3V, wherein Vcom=0V, V0=3 V, and Vref=1.5 V are satisfied. Suppose that R0/Rr=Rr/R1=9 is satisfied, and if an on-resistance of the transistor 1210a can be ignored, in the case where data of a memory cell is "0", Vp0=2.7 V is satisfied, and Hi is outputted from Vout; and in the case where data of a memory cell is "1", Vp1=0.3 V is satisfied, and Lo is outputted from Vout. In this manner, reading of a memory cell can be carried out.

According to the aforementioned method, reading is carried out with a voltage value by utilizing a difference in resistance values of the memory element 1215b, and resistance division. Needless to say, the reading method is not limited to this. For example, other than using the difference in an electrical resistance, reading may be carried out by using the difference in current values. Further, when an electrical property of a memory cell has a diode property which has a different threshold voltage with data "0" and "1," the difference in the threshold voltages may be used for reading.

A memory element having the aforementioned structure and a memory device provided with the memory element are nonvolatile memories; therefore, a battery for holding data is not necessary, and a compact size, thin, and lightweight memory device and semiconductor device can be provided. Furthermore, although data writing (additional writing of data) is possible by using the insulating material used in the aforementioned embodiment modes as an insulating layer, rewriting of data cannot be carried out. Consequently, falsification can be prevented and a memory device and semiconductor device with high security can be provided.

Note that this embodiment mode can be carried out by freely combining with a structure of a memory element, and a memory device and a semiconductor device that are provided with the memory element, which are described in the aforementioned embodiment modes.

This application is based on Japanese Patent Application serial no. 2005-147599 filed in Japan Patent Office on 20 May 2005, the entire contents of which are hereby incorporated by reference.

What is claimed is:

1. A semiconductor device comprising a memory element comprising an insulating layer and an organic compound layer, the insulating layer is formed between the organic compound layer and at least one of a first conductive layer and a second conductive layer,
   wherein the first and second conductive layers are short-circuited when an organic compound of the organic compound layer is melted to aggregate into a discontinuous ball shape due to surface tension of the organic compound by applying a voltage to the first and second conductive layers;
   writing to the memory element is carried out by applying a voltage to the first and second conductive layers, and
   the melted organic compound has surface tension higher than the insulating layer.

2. A semiconductor device according to claim 1, wherein the first conductive layer and the second conductive layer are partially brought into contact with each other after writing to the memory element is carried out.

3. A semiconductor device according to claim 1, wherein film thickness of the organic compound layer is changed after writing to the memory element is carried out.

4. A semiconductor device according to claim 1, wherein the organic compound is melted and then writing to the memory element is carried out.

5. A semiconductor device according to claim 1 wherein thickness of the insulating layer is 4 nm or less.

6. A semiconductor device comprising a memory element comprising an insulating layer and an organic compound layer having contact with the insulating layer, the insulating layer and the organic compound layer provided between a first conductive layer and a second conductive layer, the insulating layer is formed between the organic compound layer and at least one of the first conductive layer and the second conductive layer,
   wherein the first and second conductive layers are short-circuited, when an organic compound of the organic compound layer is melted to aggregate into a discontinuous ball shape due to surface tension of the organic compound by applying a voltage to the first and second conductive layers;
   writing to the memory element is carried out by applying a voltage to the first and second conductive layers,
   the melted organic compound has surface tension higher than the insulating layer, and
   the organic compound has a hole-transporting property.

7. A semiconductor device according to claim 6, wherein the first conductive layer and the second conductive layer are partially brought into contact with each other after writing to the memory element is carried out.

8. A semiconductor device according to claim 6, wherein film thickness of the organic compound layer is changed after writing to the memory element is carried out.

9. A semiconductor device according to claim 6, wherein the organic compound is melted and then writing to the memory element is carried out.

10. A semiconductor device according to claim 6 wherein thickness of the insulating layer is 4 nm or less.

11. A semiconductor device comprising a memory element comprising an insulating layer and an organic compound layer having contact with the insulating layer, the insulating layer and the organic compound layer provided between a first conductive layer and a second conductive layer, the insulating layer is formed between the organic compound layer and at least one of the first conductive layer and the second conductive layer,
   wherein the first and second conductive layers are short-circuited when an organic compound of the organic compound layer is melted to aggregate into a discontinuous ball shape due to surface tension of the organic compound by applying a voltage to the first and second conductive layers, and the melted organic compound has low wettability against a surface of the insulating layer;

writing to the memory element is carried out by applying a voltage to the first and second conductive layers, and the melted organic compound has surface tension higher than the insulating layer.

12. A semiconductor device according to claim 11, wherein the first conductive layer and the second conductive layer are partially brought into contact with each other after writing to the memory element is carried out.

13. A semiconductor device according to claim 11, wherein film thickness of the organic compound layer is changed after writing to the memory element is carried out.

14. A semiconductor device according to claim 11, wherein the organic compound is melted and then writing to the memory element is carried out.

15. A semiconductor device according to claim 11 wherein thickness of the insulating layer is 4 nm or less.

16. A semiconductor device comprising a memory element comprising an insulating layer and an organic compound layer having contact with the insulating layer, the insulating layer and the organic compound layer provided between a first conductive layer and a second conductive layer, the insulating layer is formed between the organic compound layer and at least one of the first conductive layer and the second conductive layer, wherein the first and second conductive layers are short-circuited when an organic compound of the organic compound layer is melted to aggregate into a discontinuous ball shape due to surface tension of the organic compound by applying a voltage to the first and second conductive layers, and the melted organic compound has low wettability against a surface of the insulating layer to promote an aggregation by the low wettability;

writing to the memory element is carried out by applying a voltage to the first and second conductive layers, and the melted organic compound has surface tension higher than the insulating layer.

17. A semiconductor device according to claim 16, wherein the first conductive layer and the second conductive layer are partially brought into contact with each other after writing to the memory element is carried out.

18. A semiconductor device according to claim 16, wherein film thickness of the organic compound layer is changed after writing to the memory element is carried out.

19. A semiconductor device according to claim 16, wherein the organic compound is melted and then writing to the memory element is carried out.

20. A semiconductor device according to claim 16 wherein thickness of the insulating layer is 4 nm or less.

21. A method for writing a memory element, the memory element comprising an insulating layer and an organic compound layer, the insulating layer and the organic compound layer provided between a first conductive layer and a second conductive layer wherein the insulating layer is provided between the organic compound layer and one of the first conductive layer and the second conductive layer, the method comprising:

applying a voltage between the first conductive layer and the second conductive layer to melt the organic compound layer, wherein the melted organic compound has surface tension higher than the insulating layer, and wherein the first and second conductive layers are short-circuited when the organic compound layer is melted to aggregate into a discontinuous ball shape due to surface tension of the organic compound by applying the voltage between the first and second conductive layers.

22. A method for writing a memory element according to claim 21 wherein thickness of the insulating layer is 4 nm or less.

23. A method for writing a memory element, the memory element comprising an insulating layer and an organic compound layer, the insulating layer and the organic compound layer provided between a first conductive layer and a second conductive layer wherein the insulating layer is provided between the organic compound layer and one of the first conductive layer and the second conductive layer, the method comprising:

applying a voltage between the first conductive layer and the second conductive layer to melt the organic compound layer, wherein the melted organic compound has surface tension higher than the insulating layer, and wherein the first and second conductive layers are short-circuited when the organic compound layer is melted to aggregate into a discontinuous ball shape due to surface tension of the organic compound by applying the voltage between the first and second conductive layers.

24. A method for writing a memory element according to claim 23 wherein thickness of the insulating layer is 4 nm or less.

* * * * *